US009443866B1

(12) United States Patent
Sakakibara

(10) Patent No.: US 9,443,866 B1
(45) Date of Patent: Sep. 13, 2016

(54) MID-TUNNELING DIELECTRIC BAND GAP MODIFICATION FOR ENHANCED DATA RETENTION IN A THREE-DIMENSIONAL SEMICONDUCTOR DEVICE

(71) Applicant: SANDISK TECHNOLOGIES INC., Plano, TX (US)

(72) Inventor: Kiyohiko Sakakibara, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/666,789

(22) Filed: Mar. 24, 2015

(51) Int. Cl.
*H01L 27/115* (2006.01)
*H01L 21/31* (2006.01)
*H01L 29/10* (2006.01)
*H01L 21/311* (2006.01)
*H01L 21/02* (2006.01)
(Continued)

(52) U.S. Cl.
CPC ..... *H01L 27/11582* (2013.01); *G11C 16/0483* (2013.01); *G11C 16/06* (2013.01); *H01L 21/0214* (2013.01); *H01L 21/0223* (2013.01); *H01L 21/02247* (2013.01); *H01L 21/28273* (2013.01); *H01L 21/28282* (2013.01); *H01L 21/31* (2013.01); *H01L 21/31116* (2013.01); *H01L 27/11519* (2013.01); *H01L 27/11521* (2013.01); *H01L 27/11556* (2013.01); *H01L 27/11565* (2013.01); *H01L 27/11568* (2013.01); *H01L 29/1033* (2013.01); *H01L 29/4234* (2013.01); *H01L 29/42324* (2013.01); *H01L 29/66825* (2013.01); *H01L 29/66833* (2013.01); *H01L 29/7889* (2013.01); *H01L 29/7926* (2013.01)

(58) Field of Classification Search
CPC .......... H01L 27/11568; H01L 27/11578; H01L 27/1158; H01L 27/11582
See application file for complete search history.

(56) References Cited

U.S. PATENT DOCUMENTS 5,915,167 A 6/1999 Leedy
7,927,953 B2 * 4/2011 Ozawa ............ H01L 21/28282
257/E21.21

(Continued)

OTHER PUBLICATIONS

Endoh, et al., "Novel Ultra High Density Memory with a Stacked-Surrounding Gate Transistor (S-SGT) Structured Cell," IEDM Proc. (2001) 33-36.

(Continued)

*Primary Examiner* — Allison P Bernstein
(74) *Attorney, Agent, or Firm* — The Marbury Law Group PLLC

(57) ABSTRACT

A tunneling dielectric layer for a vertical memory device is formed with a stack that provides a barrier height profile for high data retention tolerance. Memory stack structures extend through a stack of insulating layers and electrically conductive layers. Each memory stack structure comprises, from outside to inside, a blocking dielectric, memory elements, a tunneling dielectric layer, and a vertical semiconductor channel. The tunneling dielectric layer comprises, from outside to inside, an outer silicon oxide layer, a first silicon oxynitride layer having a first atomic nitrogen concentration, a second silicon oxynitride layer having a second atomic nitrogen concentration that is less than the first atomic nitrogen concentration, and an inner silicon oxide layer that contacts a vertical semiconductor channel. The reduced band gap of the first silicon oxynitride layer relative to the second silicon oxynitride layer provides additional energy barrier for relaxation of holes stored in the memory elements.

30 Claims, 16 Drawing Sheets

(51) Int. Cl.

| | |
|---|---|
| *H01L 29/66* | (2006.01) |
| *H01L 29/792* | (2006.01) |
| *H01L 29/788* | (2006.01) |
| *H01L 29/423* | (2006.01) |
| *H01L 21/28* | (2006.01) |
| *G11C 16/04* | (2006.01) |
| *G11C 16/06* | (2006.01) |

(56) References Cited

U.S. PATENT DOCUMENTS

| | | | |
|---|---|---|---|
| 8,254,175 B2 * | 8/2012 | Higuchi | H01L 21/28282 257/324 |
| 2008/0012065 A1 | 1/2008 | Kumar | |
| 2008/0173930 A1 | 7/2008 | Watanabe et al. | |
| 2010/0176439 A1 | 7/2010 | Yonamoto | |
| 2011/0075486 A1 | 3/2011 | Liao et al. | |
| 2013/0234222 A1 | 9/2013 | Yasuda et al. | |
| 2014/0073099 A1 * | 3/2014 | Park | H01L 29/42332 438/268 |
| 2015/0194440 A1 * | 7/2015 | Noh | H01L 29/66833 257/324 |
| 2016/0118398 A1 * | 4/2016 | Yon | H01L 27/11582 257/314 |

OTHER PUBLICATIONS

Lue, H-T, et al., "BE-SONOS: A Bandgap Engineered SONOS with Excellent Performance and Reliability," Emerging Central Lab, *Technology Development Center, Macronix International Co. Ltd. 16, Li-Hsin Road, Hsinchu Science Park, Hsinchu 300, Taiwan, 4 pages.

Muraoka, K. et al., "Optimum structure of deposited ultrathin silicon oxynitride film to minimize leakage current," Journal of Applied Physics, vol. 94, No. 3, pp. 2039-2045, (2003).

Sakakibara, K. et al., "A Quantitative Analysis of Time-Decay Reproducible Stress-Induced Leakage Current in $SiO_2$ Films," IEEE Transactions on Electron Devices, vol. 44, No. 6, pp. 1002-1008, (1997).

Sakakibara, K. et al., "Influence of Holes on Neutral Trap Generation," IEEE Transactions on Electron Devices, vol. 44, No. 12, pp. 2274-2280, (1997).

Tsuji, N. et al., "Microscopic and Statistical Approach to SILC Characteristics—Exponential Relation between Distributed Fowler Nordheim Coefficients and its Physical Interpretation," 1998 Symposium on VLSI Technology Digest of Technical Papers, No. 20.1, pp. 196-197, (1998).

U.S. Appl. No. 14/133,979, filed Dec. 19, 2013, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

U.S. Appl. No. 14/529,942, filed Oct. 31, 2014, SanDisk Technologies Inc.

* cited by examiner

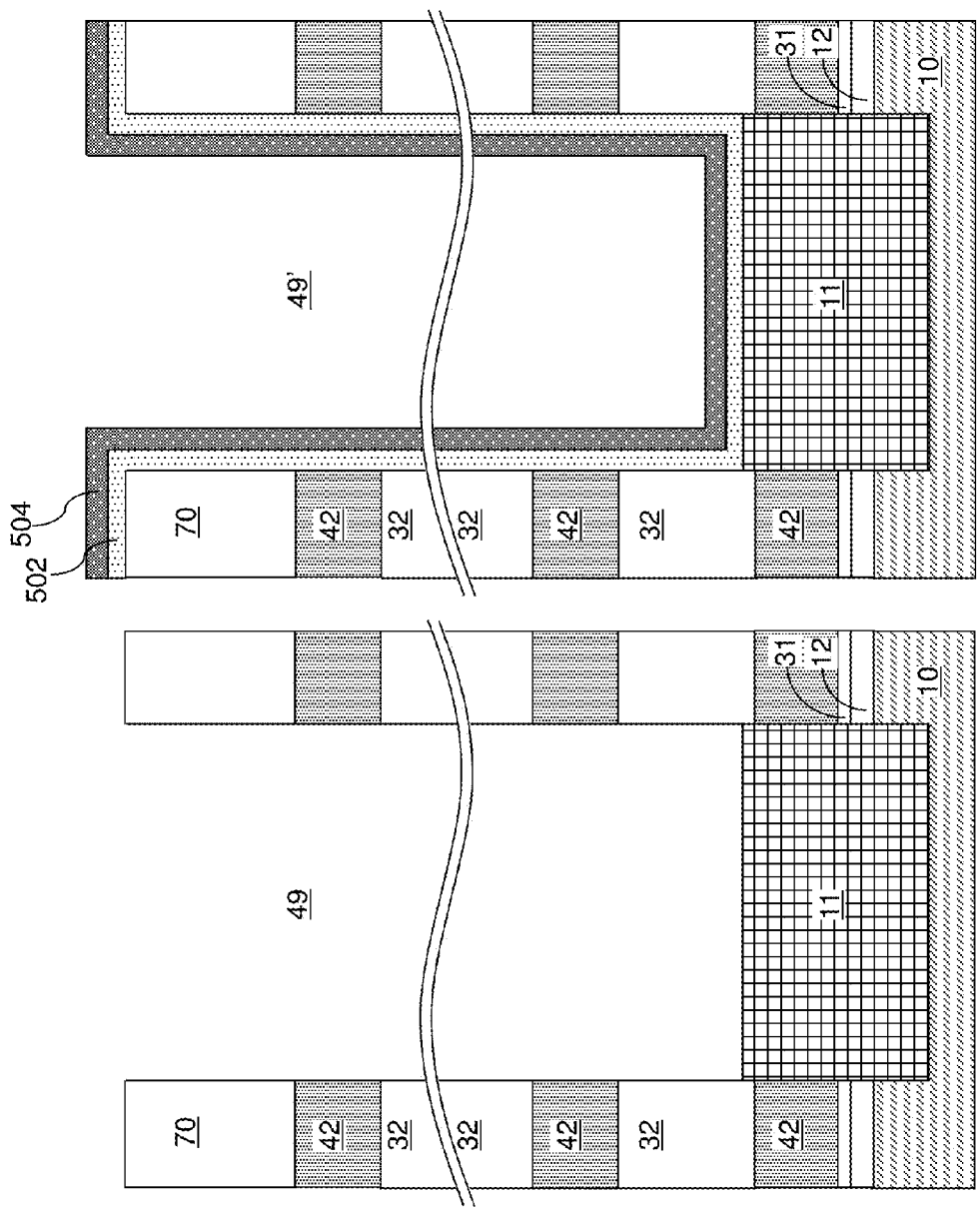

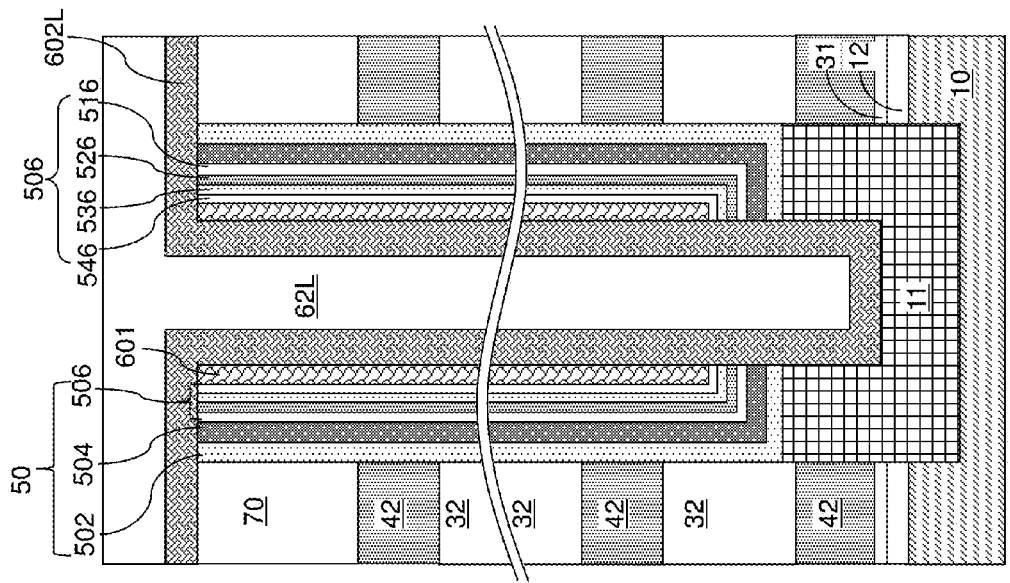
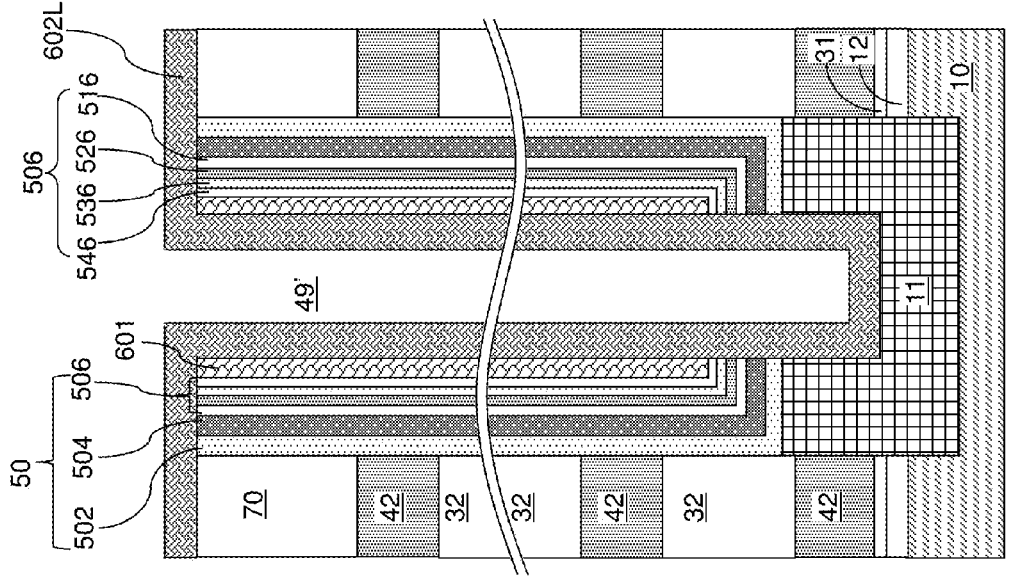

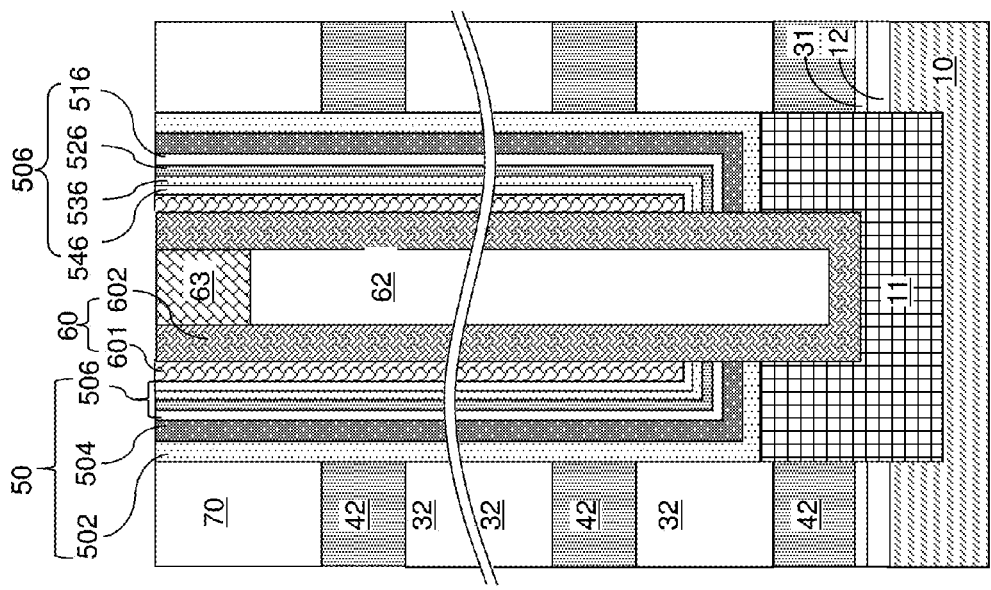
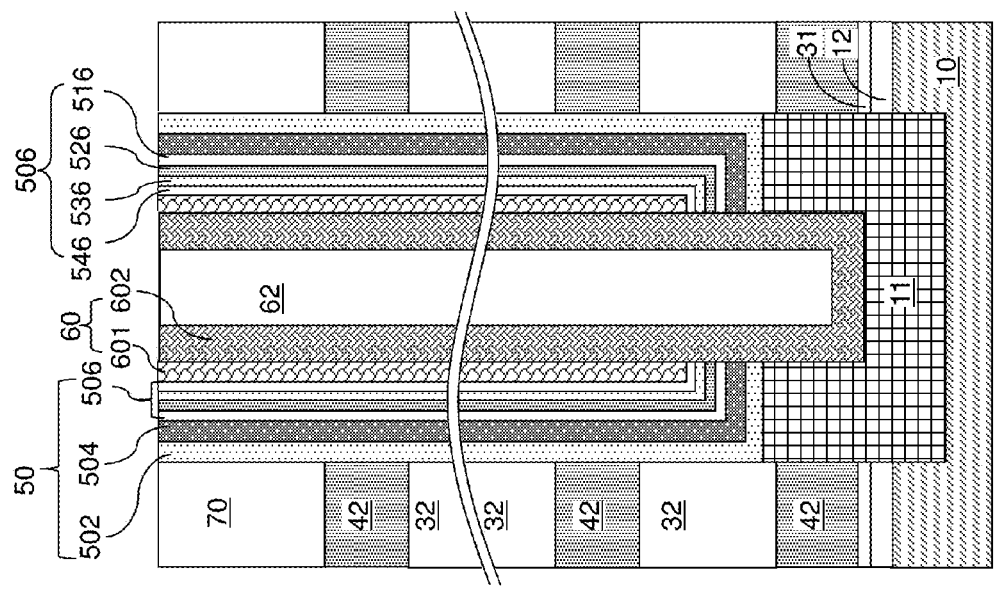

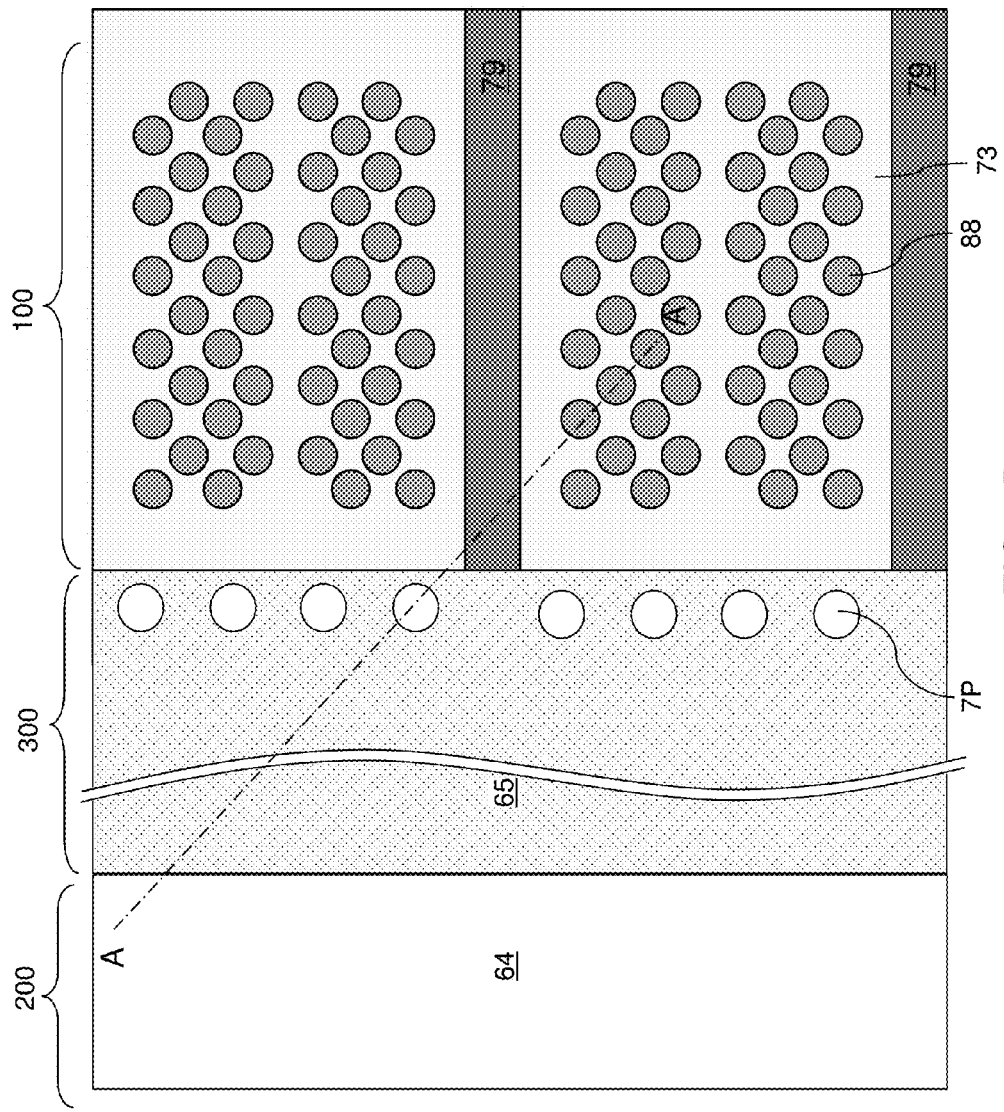

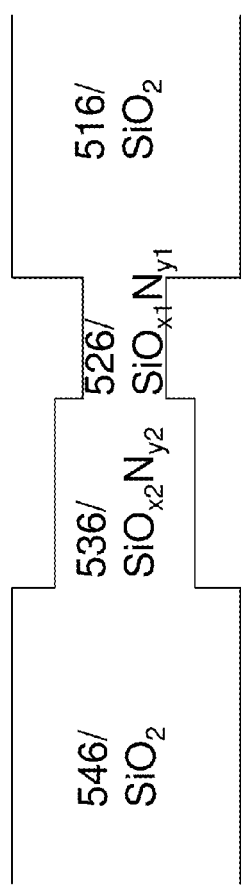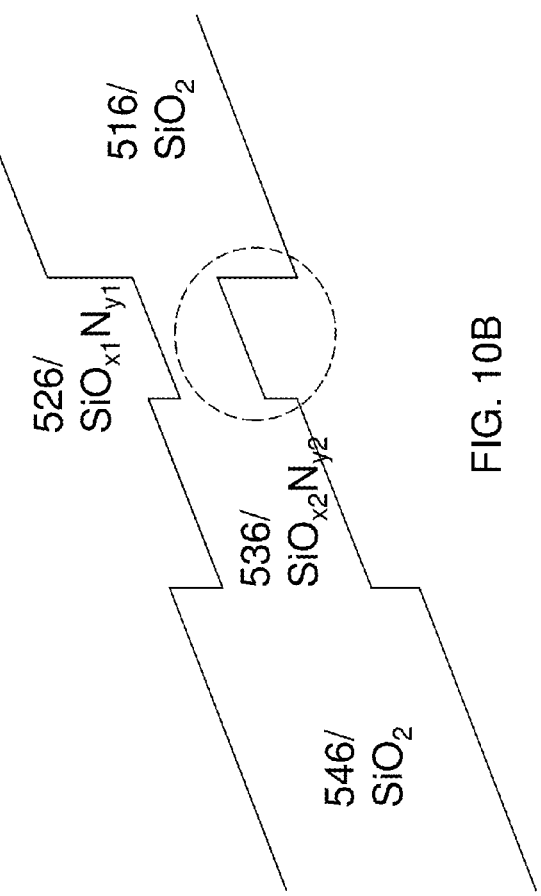
FIG. 10A
FIG. 10B

US 9,443,866 B1

MID-TUNNELING DIELECTRIC BAND GAP MODIFICATION FOR ENHANCED DATA RETENTION IN A THREE-DIMENSIONAL SEMICONDUCTOR DEVICE

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises: a stack of alternating layers comprising insulating layers and electrically conductive layers and located over a substrate; an array of memory openings extending through the stack; and a plurality of memory stack structures located within a respective memory opening. Each of the plurality of memory structures comprises a vertical stack of memory elements, a tunneling dielectric layer, and a vertical semiconductor channel. The tunneling dielectric layer comprises, from outside to inside, an outer silicon oxide layer; a first silicon oxynitride layer having a first atomic nitrogen concentration; a second silicon oxynitride layer having a second atomic nitrogen concentration that is less than the first atomic nitrogen concentration; and an inner silicon oxide layer that contacts a respective vertical semiconductor channel.

According to another aspect of the present disclosure, a method of manufacturing a memory device is provided. A stack of alternating layers comprising insulating layers and material layers is formed over a substrate. A plurality of memory openings is formed through the stack. A set of memory elements is formed within each of the plurality of memory openings. An outer silicon oxide layer is formed over each set of memory elements. A first silicon oxynitride layer having a first atomic nitrogen concentration is formed over the outer silicon oxide layer. A second silicon oxynitride layer is formed over the first silicon oxynitride layer. The second silicon oxynitride layer has a second atomic nitrogen concentration that is less than the first atomic nitrogen concentration. An inner silicon oxide layer is formed over the second silicon oxynitride layer. A vertical semiconductor channel is formed on the inner silicon oxide layer.

BRIEF DESCRIPTION OF THE DRAWINGS

FIGS. 2A-2H are sequential vertical cross-sectional views of a memory opening within the exemplary structure during various processing steps employed to form a memory stack structure according to an embodiment of the present disclosure.

FIG. 5B is a partial see-through top-down view of the exemplary structure of FIG. 5A. The vertical plane A-A' is the plane of the vertical cross-sectional view of FIG. 5A.

FIG. 10A is a band diagram of a tunneling dielectric layer of the exemplary structure in the absence of an electrical bias according to an embodiment of the present disclosure.

FIG. 10B is a band diagram of a tunneling dielectric layer of the exemplary structure under an electrical bias according to an embodiment of the present disclosure.

DETAILED DESCRIPTION

Figure 1:
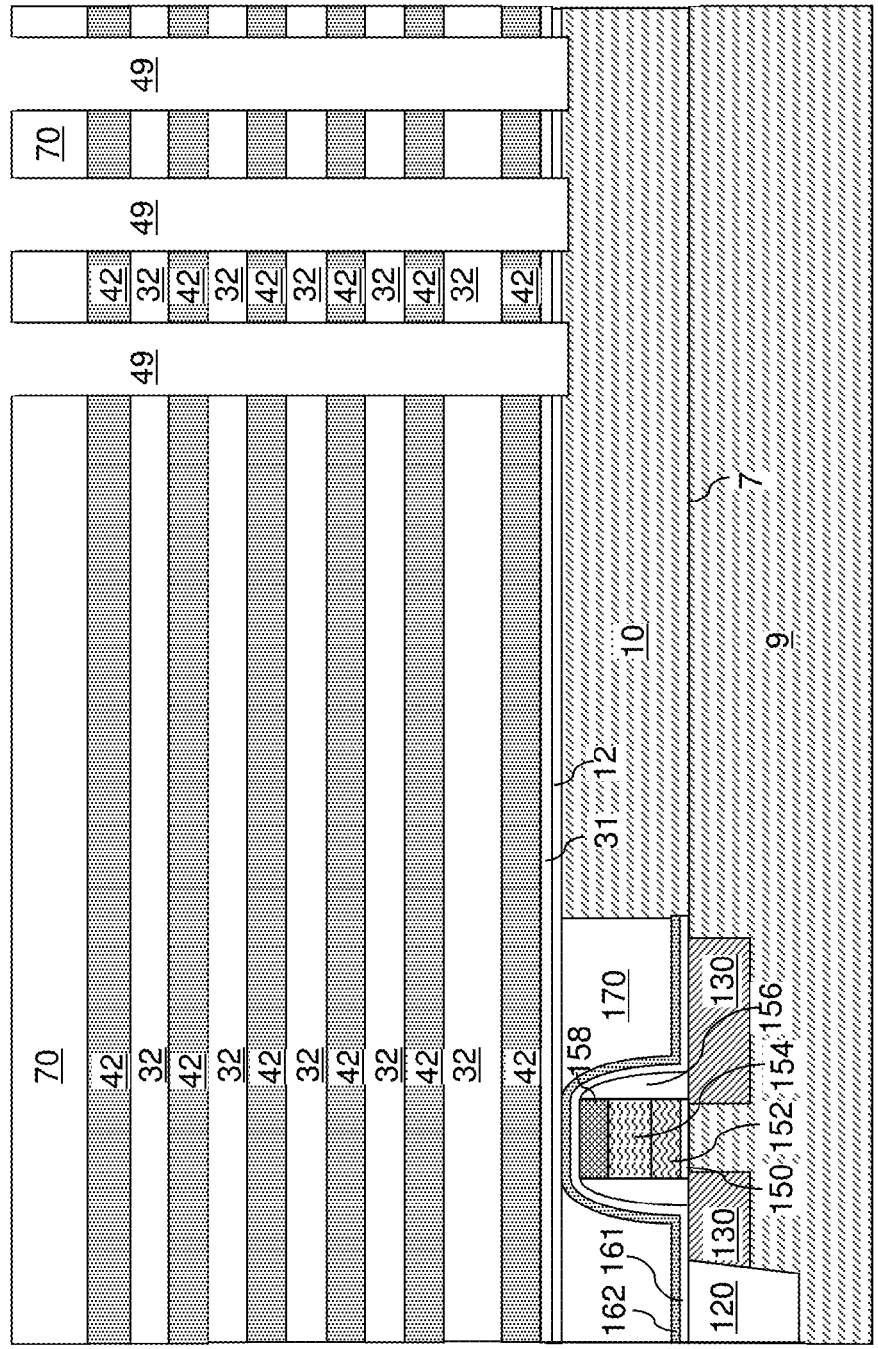
FIG. 1 is a vertical cross-sectional view of an exemplary structure after formation of a stack including an alternating plurality of material layers and memory openings extending through the stack according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure.

As used herein, a "band gap" refers to the difference between the energy levels of a conduction band and a valence band of a material. As used herein, a "band gap shift" refers to a difference between the band gaps at an interface between two different materials.

A monolithic three-dimensional memory array is one in which multiple memory levels are formed above a single substrate, such as a semiconductor wafer, with no intervening substrates. The term "monolithic" means that each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2H illustrate sequential vertical cross-sectional views of a memory opening within the exemplary structure during formation of an exemplary memory stack structure according to a first embodiment of the present disclosure. Formation of the exemplary memory stack structure can be performed within each of the memory openings 49 in the exemplary structure illustrated in FIG. 1.

Referring to FIG. 2A, a memory opening 49 in the exemplary structure of FIG. 1 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

An epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

Referring to FIG. 2B, a series of layers including at least one blocking dielectric layer 502 and a memory material layer 504 can be sequentially deposited within each memory opening 49. A remaining unfilled portion of each memory opening constitutes a cavity 49'. The at least one blocking dielectric layer 502 can be deposited on the sidewalls of each memory opening 49 by a conformal deposition method. Each of the at least one blocking dielectric layer 502 includes a dielectric material, which can be selected, for example, from silicon oxide, silicon oxynitride, and a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the at least one blocking dielectric layer 502 can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide material can be deposited, for example, by chemical vapor deposition (CVD), atomic layer deposition (ALD), pulsed laser deposition (PLD), liquid source misted chemical deposition, or a combination thereof. Alternatively or additionally, the at least one blocking dielectric layer 502 can comprise silicon oxide or silicon nitride, which can be deposited by chemical vapor deposition or atomic layer deposition. The thickness of the at least one blocking dielectric layer 502 can be in a range from 1 nm to 20 nm, although lesser and greater thicknesses can also be employed. The at least one blocking dielectric layer 502 can subsequently function as a dielectric material portion that blocks leakage of stored electrical charges to control gate electrodes. In one embodiment, the at least one blocking dielectric layer 502 includes aluminum oxide. The at least one blocking dielectric layer 502 can be a single dielectric material layer or a stack of multiple dielectric material layers having different compositions.

The memory material layer 504 includes a material that can provide a vertically spaced stack of memory elements. In one embodiment, the memory material layer 504 can be a charge trapping material including a dielectric charge trapping material, which can be, for example, silicon nitride. Alternatively, the memory material layer 504 can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504 includes a silicon nitride layer.

The memory material layer 504 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504 may comprise an insulating charge trapping material, such as one or more silicon nitride segments. Alternatively, the memory material layer 504 may comprise conductive nanoparticles such as metal nanoparticles, which can be, for example, ruthenium nanoparticles. The memory material layer 504 can be formed, for example, by chemical vapor deposition (CVD), atomic layer deposition (ALD), physical vapor deposition (PVD), or any suitable deposition technique for storing electrical charges therein. The thickness of the memory material layer 504 can be in a range from 2 nm to 20 nm, although lesser and greater thicknesses can also be employed. Each vertically extending portion of the memory material layer 504 in a memory opening constitutes a vertical stack of memory elements.

Figure 2C:
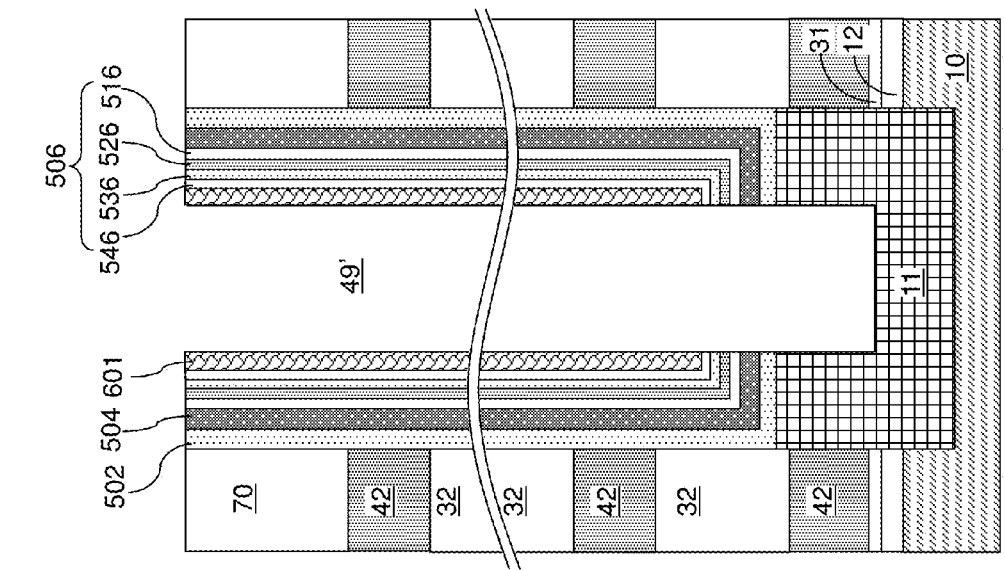

Referring to FIG. 2C, a tunneling dielectric layer 506 and an optional first semiconductor channel layer 601L can be sequentially deposited in each cavity 49'. The tunneling dielectric layer 506 includes a stack of layers (516, 526, 536, 546) such that the band gap structure exhibits an asymmetric band gap change around inner tunneling dielectric layers (526, 536). Specifically, the dielectric materials of the various materials within the tunneling dielectric layer 506 are selected such that a first band gap shift at an interface between an outer tunneling dielectric layer 516 and a set of middle tunneling dielectric layers (526, 536) is greater than a second band gap shift at an interface between an inner tunneling dielectric layer 546 and the set of middle tunneling dielectric layers (526, 536).

In one embodiment, the tunneling dielectric layer 506 can comprise a stack, from outside to inside, an outer silicon oxide layer 516, a first silicon oxynitride layer 526, a second silicon oxynitride layer 536, and an inner silicon oxide layer 546. The outer silicon oxide layer 516 can be formed over a plurality of vertical stack of memory elements that are embodied as the memory material layer 504 that contiguously extends into a plurality of memory openings 49. The first silicon oxynitride layer 526 can be formed over the outer silicon oxide layer 516. The second silicon oxynitride layer 536 can be formed over the first silicon oxynitride layer 526. The inner silicon oxide layer 546 can be formed over the second silicon oxynitride layer 536. As used herein, a "silicon oxide layer" refers to a layer consisting essentially of a dielectric compound of silicon and oxygen. A "silicon oxynitride layer" refers to a layer consisting essentially of a dielectric compound of silicon, oxygen, and nitrogen.

The outer silicon oxide layer 516 and the inner silicon oxide layer 546 can have the composition of $SiO_2$. In one embodiment, the first silicon oxynitride layer 526 can have a first atomic nitrogen concentration, and the second silicon oxynitride layer 536 can have a second atomic nitrogen concentration that is less than the first atomic nitrogen concentration. Further, the first silicon oxynitride layer 526 can have a first atomic oxygen concentration, and the second silicon oxynitride layer 536 can have a second atomic oxygen concentration that is greater than the first atomic oxygen concentration. In one embodiment, the first silicon oxynitride layer 526 can consist essentially of silicon, oxygen, and nitrogen, and the second silicon oxynitride layer 536 can consist essentially of silicon, oxygen, and nitrogen.

In one embodiment, the first silicon oxynitride layer 526 can have a composition of $SiO_{x1}N_{y1}$, and the second silicon oxynitride layer 536 has a composition of $SiO_{x2}N_{y2}$. The ratio of nitrogen atoms to silicon atoms in the first silicon oxynitride layer 526, i.e., y1, is greater than the ratio of nitrogen atoms to silicon atoms in the second silicon oxynitride layer 536, i.e., y2. The ratio of oxygen atoms to silicon atoms in the first silicon oxynitride layer 526, i.e., x1, is less than the ratio of oxygen atoms to silicon atoms in the second silicon oxynitride layer 536, i.e., x2.

In one embodiment, x1 can be in a range from 0.5 to 1.5 (for example, from 0.75 to 1.25), and y1 can be in a range from 0.33 to 1 (for example, from 0.5 to 0.83), although lesser and greater values can also be employed. In one embodiment, x2 can be in a range from 0.75 to 1.9 (for example, from 1.0 to 1.75), and y2 can be in a range from 0.07 to 0.83 (for example, from 0.17 to 0.67), although lesser and greater values can also be employed. In one embodiment, the first silicon oxynitride layer 526 can be substantially stoichiometric. In this case, x1+1.5y1 can be substantially equal to 2.0 and x2+1.5y2 can be substantially equal to 2.0.

In one embodiment, each of the first silicon oxynitride layer 526 and the second silicon oxynitride layer 536 can be deposited by a conformal deposition method such as chemical vapor deposition and atomic layer deposition. In this case, a silicon precursor gas (such as $SiH_4$, $SiH_2Cl_2$, $Si_2H_6$, $SiHCl_3$, or $SiCl_4$) can be flowed into a process chamber including the first exemplary semiconductor structure, while an oxygen source gas (such as oxygen or steam) and a nitrogen source gas (such as $N_2O$ or NO) are simultaneously or alternately flowed into the same process chamber. Process parameters for the deposition process, including the flow rates of the silicon precursor gas, the oxygen source gas, and the nitrogen source gas, the temperature of the deposition process, the pressure of the deposition process, and any carrier gas or valence gas, can be selected to obtain the target composition for the first silicon oxynitride layer 526 and the second silicon oxynitride layer 536. In this case, the first silicon oxynitride layer 526 can have a first homogeneous composition throughout the entirety thereof, and the second silicon oxynitride layer 536 can have a second homogeneous composition throughout the entirety thereof.

Alternatively, the first silicon oxynitride layer 526 can be formed by depositing an initial silicon nitride layer over the outer silicon oxide layer 516, and converting the initial silicon nitride layer into the first silicon oxynitride layer 526 by performing an oxidation process on the initial silicon nitride layer. In this case, the oxidation process can comprise at least one a thermal oxidation process and a plasma oxidation process. The second silicon oxynitride layer 536 can be formed by depositing an initial silicon oxide layer over the outer silicon oxide layer 516, and converting the initial silicon oxide layer into the silicon oxynitride layer by performing a nitridation process on the initial silicon oxide layer. In this case, the nitridation process can comprise at least one of a thermal nitridation process and a plasma nitridation process.

In one embodiment, the thickness of the first silicon oxynitride layer 526 can be in a range from 0.5 nm to 5.0 nm (for example, from 0.7 nm to 4.0 nm), and the thickness of the second silicon oxynitride layer 536 can be in a range from 0.5 nm to 5.0 nm (for example, from 0.7 nm to 4.0 nm), although lesser and greater thicknesses can be employed for each of the first silicon oxynitride layer 526 and the second silicon oxynitride layer 536. In one embodiment, the combination of the first silicon oxynitride layer 526 and the second silicon oxynitride layer 536 can have a thickness in a range from 1.5 nm to 6.0 nm, although lesser and greater thicknesses can also be employed. In one embodiment, the thickness of the outer silicon oxide layer 516 can be in a range from 0.5 nm to 3.0 nm, although lesser and greater thicknesses can also be employed. In one embodiment, the thickness of the inner silicon oxide layer 546 can be in a range from 0.5 nm to 3.0 nm, although lesser and greater thicknesses can also be employed. The thickness of the tunneling dielectric layer 506 can be in a range from 2 nm to 20 nm, although lesser and greater thicknesses can also be employed.

Charge tunneling can be performed through the tunneling dielectric layer 506 under suitable electrical bias conditions during operation of a completed memory device, which can comprise a monolithic three-dimensional NAND string memory device. The charge tunneling may be performed through hot-carrier injection or by Fowler-Nordheim tunneling induced charge transfer depending on the mode of operation of the monolithic three-dimensional NAND string memory device to be formed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (502, 504, 506, 601L).

Figure 2D:
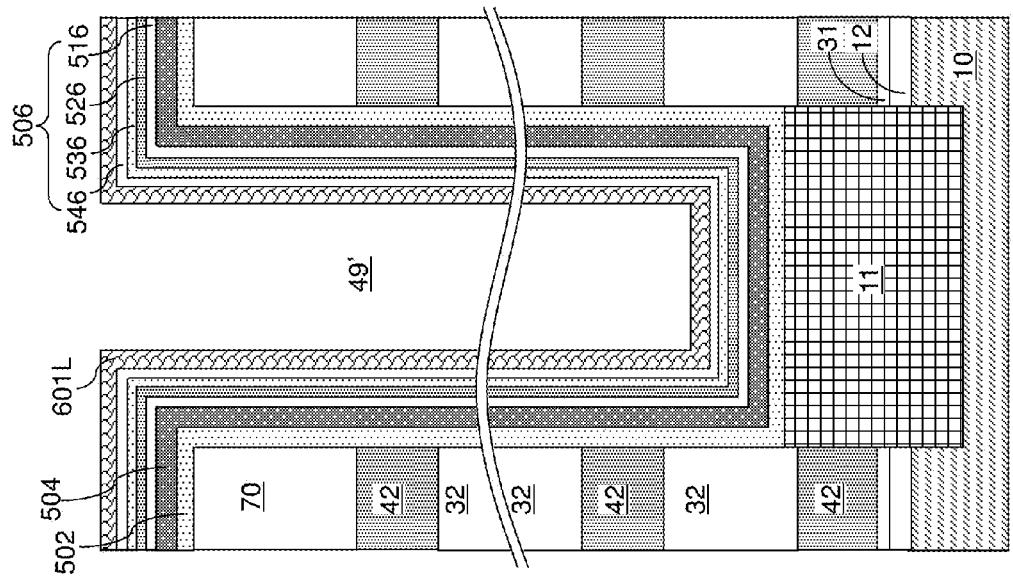

Referring to FIG. 2D, the optional first semiconductor channel 601L, the tunneling dielectric layer 506, the memory material layer 504, the at least one blocking dielectric layer 502 are sequentially anisotropically etched employing at least one anisotropic etch process. The portions of the first semiconductor channel layer 601L, the tunneling dielectric layer 506, the memory material layer 504, and the at least one blocking dielectric layer 502 located above the top surface of the insulating cap layer 70 can be removed by the at least one anisotropic etch process. Further, the horizontal portions of the first semiconductor channel layer 601L, the tunneling dielectric layer 506, the memory material layer 504, and the at least one blocking dielectric layer 502 at a bottom of each cavity 49' can be removed to form openings in remaining portions thereof. Each of the first semiconductor channel layer 601L, the tunneling dielectric layer 506, the memory material layer 504, and the at least one blocking dielectric layer 502 can be etched by anisotropic etch process.

Each remaining portion of the first semiconductor channel layer 601L within a memory opening constitutes a first semiconductor channel portion 601. Each remaining portion of the tunneling dielectric layer 506 within a memory opening constitutes a tunneling dielectric for a memory stack structure to be formed within the memory opening. Thus, the tunneling dielectric layer 506 embodied as a contiguous dielectric material layer without any opening therein prior to the anisotropic etch is divided into a plurality of mutually disjoined tunneling dielectric layers 506. As used herein, elements are mutually disjoined from one another if the elements do not physically contact one another. Specifically, each of the outer silicon oxide layer 516, the first and second silicon oxynitride layers (526, 536), and the inner silicon oxide layer 546 can be a contiguous dielectric material layer without any opening therein prior to the anisotropic etch, and can be divided into a plurality of mutually disjoined dielectric material layers, i.e., a set of mutually disjoined outer silicon oxide layers 516, a set of mutually disjoined first silicon oxynitride layers 526, a set of mutually disjoined second silicon oxynitride layers 536, and a set of mutually disjoined inner silicon oxide layers 546, respectively. In this case, each remaining adjoining portions of the outer silicon oxide layer 516, the first and second silicon oxynitride layers (526, 536), and the inner silicon oxide layer 546 within a memory opening constitutes a tunneling dielectric layer 506 of a memory stack structure to be formed in the memory opening.

Each remaining portion of the memory material layer 504 within a memory opening functions as a plurality of vertically stacked charge storage elements. A surface of the epitaxial channel portion 11 can be physically exposed underneath the opening through the first semiconductor channel portion 601, the tunneling dielectric layer 506, the memory material layer 504, and the at least one blocking dielectric layer 502. Optionally, the physically exposed portion of the epitaxial channel portion 11 can be vertically recessed. The memory material layer 504 can comprise a charge trapping material or a floating gate material.

In one embodiment, the first semiconductor channel portion 601, the tunneling dielectric layer 506, the memory material layer 504, the second blocking dielectric 503, and the at least one blocking dielectric 502 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2E, a second semiconductor channel layer 602L can be deposited directly on the semiconductor surface of the epitaxial channel portion 11 over the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2G, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a vertical semiconductor channel 60 through which electrical current can flow when a vertical NAND device including the vertical semiconductor channel 60 is turned on. A tunneling dielectric layer 506 is embedded within a memory material layer 504, and laterally surrounds a portion of the vertical semiconductor channel 60. Each adjoining set of at least one blocking dielectric layer 502, a memory material layer 504, and a tunneling dielectric layer 506 collectively constitutes a memory film 50, which can store electrical charges with a macroscopic retention time. In some embodiments, the at least one blocking dielectric layer 502 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2H, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
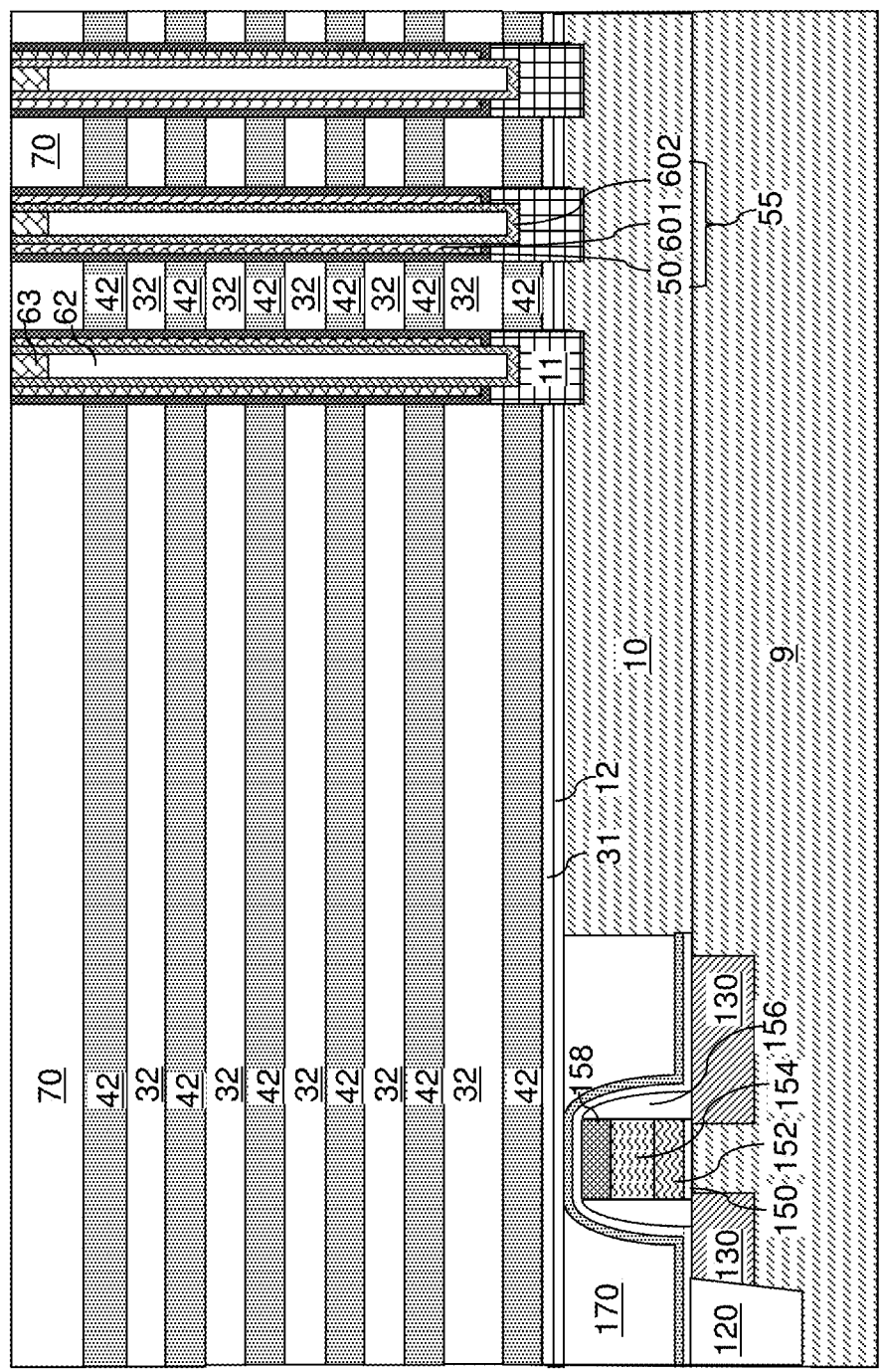
FIG. 3 is a vertical cross-sectional view of the exemplary structure after formation of memory stack structures according to an embodiment of the present disclosure.

The exemplary memory stack structure can be embedded into the exemplary structure illustrated in FIG. 1. FIG. 3 illustrates the exemplary structure that incorporates multiple instances of the exemplary memory stack structure of FIG. 2H. The exemplary structure includes a semiconductor device, which comprises a prototype stack (32, 42) including an alternating plurality of material layers (e.g., the sacrificial material layers 42) and insulating layers 32 located over a semiconductor substrate (9, 10), and a memory opening extending through the stack (32, 42). As used herein, a "prototype" structure or an "in-process" structure refers to a transient structure that is subsequently modified into another structure having at least one different shape or having at least one different component. The semiconductor device further comprises at least one blocking dielectric 502 vertically extending from a bottommost layer (e.g., the bottommost sacrificial material layer 42) of the prototype stack to a topmost layer (e.g., the topmost sacrificial material layer 42) of the prototype stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
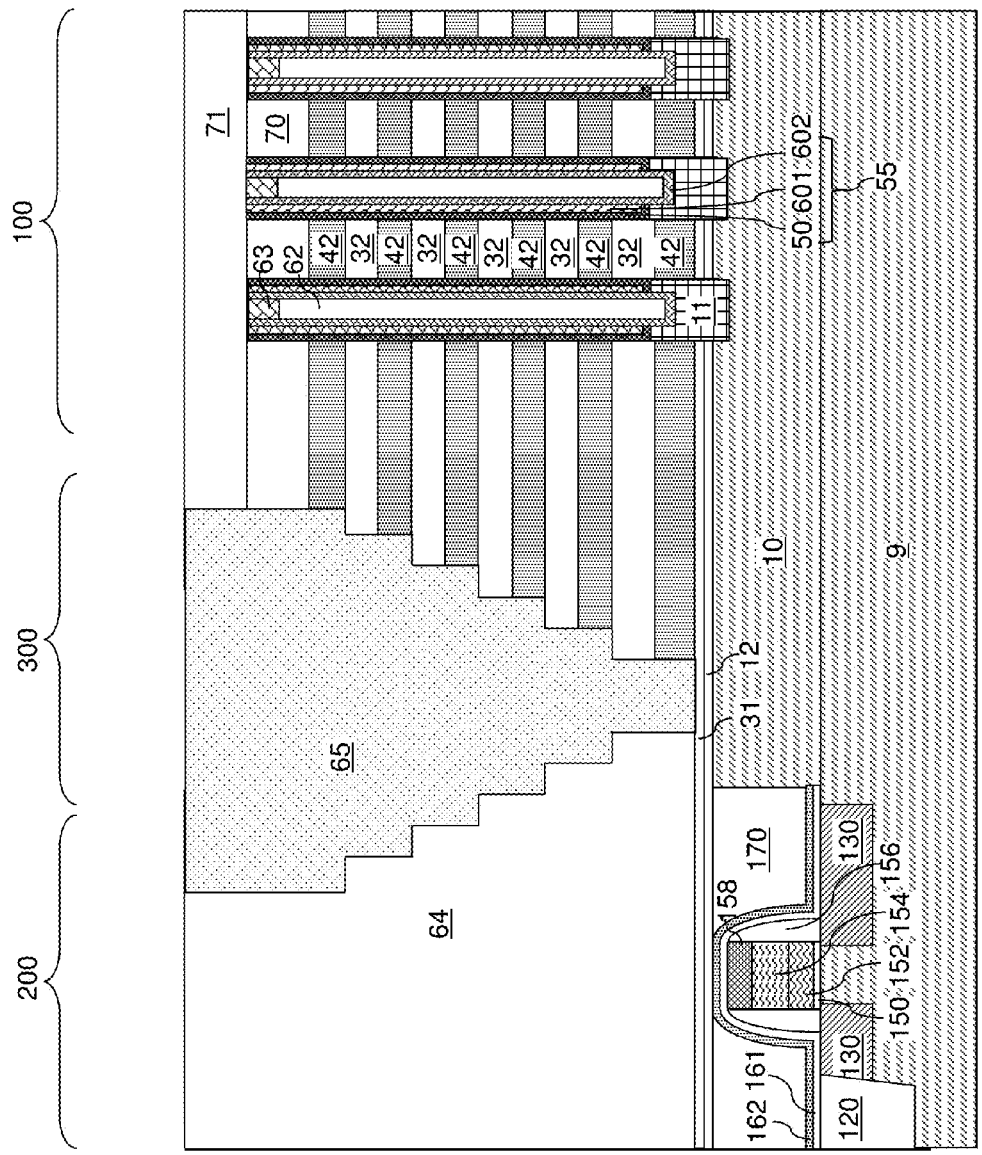
FIG. 4 is a vertical cross-sectional view of the exemplary structure after formation of a stepped terrace and a retro-stepped dielectric material portion according to an embodiment of the present disclosure.

Referring to FIG. 4, an optional first array contact level dielectric layer 71 can be formed over the substrate (9, 10). As an optional structure, the first array contact level dielectric layer 71 may, or may not, be formed. In case the first array contact level dielectric layer 71 is formed, the first array contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first array contact level dielectric layer 71 can be formed over a horizontal plane including the top surface of the insulating cap layer 70 and the top surfaces of the drain regions 63. The first array contact level dielectric layer 71 can be deposited by chemical vapor deposition, atomic layer deposition (ALD), spin-coating, or a combination thereof. The thickness of the first array contact level dielectric layer 71 can be in a range from 10 nm to 300 nm, although lesser and greater thicknesses can also be employed.

In one embodiment, the first array contact level dielectric layer 71 can be formed as a dielectric material layer having a uniform thickness throughout. The first array contact level dielectric layer 71 may be formed as a single dielectric material layer, or can be formed as a stack of a plurality of dielectric material layers. Alternatively, formation of the first array contact level dielectric layer 71 may be merged with formation of at least one line level dielectric layer (not shown). While the present disclosure is described employing an embodiment in which the first array contact level dielectric layer 71 is a structure separate from an optional second array contact level dielectric layer or at least one line level dielectric layer to be subsequently deposited, embodiments in which the first array contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first array contact level dielectric layer 71 by a planarization process such as chemical mechanical planarization and/or a recess etch. The top surfaces of the first array contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first array contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
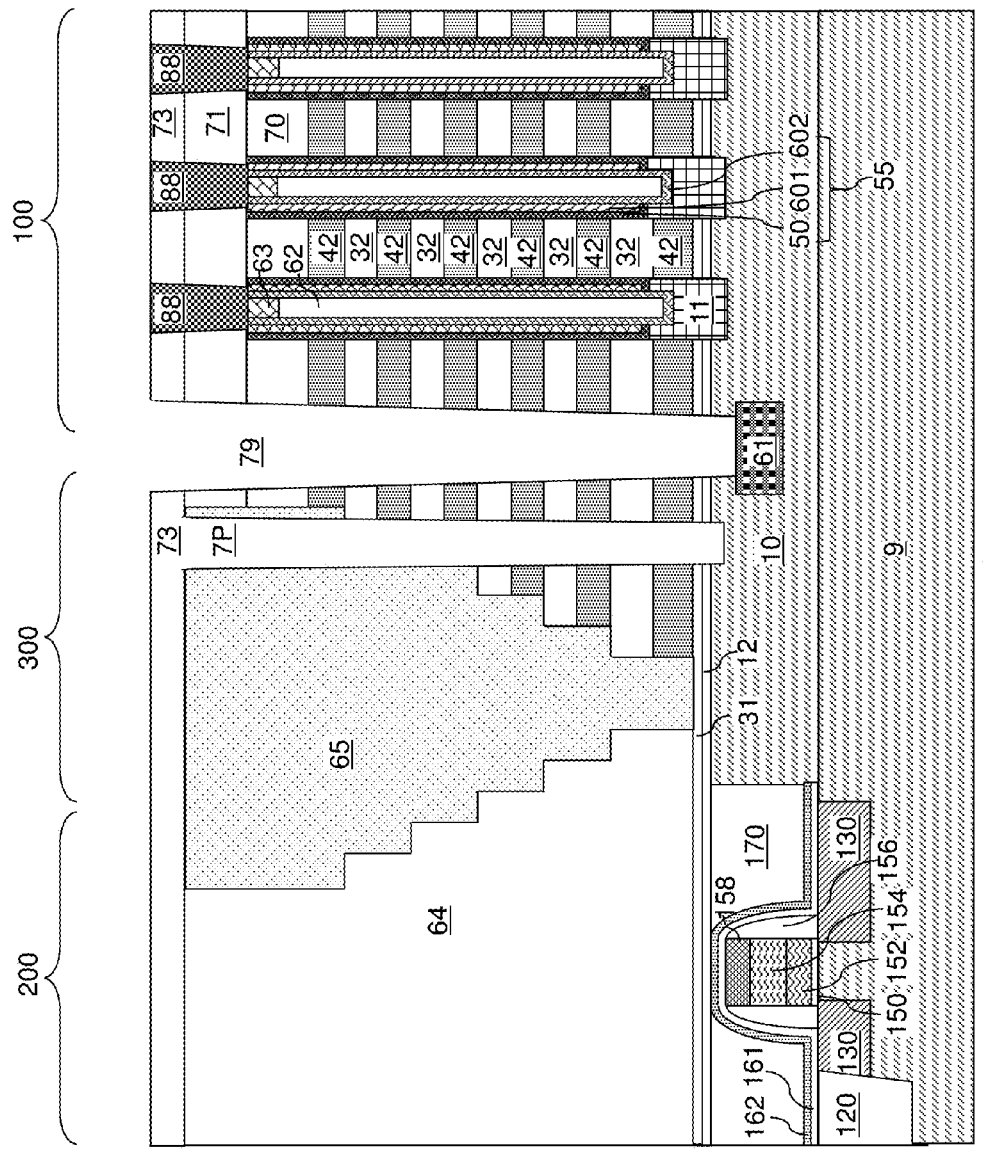
FIG. 5A is a vertical cross-sectional view of the exemplary structure after formation of a backside contact trench according to an embodiment of the present disclosure.

Referring to FIGS. 5A and 5B, at least one dielectric support pillar 7P may be optionally formed through the retro-stepped dielectric material portion 65 and/or through the first array contact level dielectric layer 71 and/or through the alternating stack (32, 42). In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first array contact level dielectric layer 71 concurrently with deposition of the at least one dielectric support pillar 7P can be present over the first array contact level dielectric layer 71 as a second array contact level dielectric layer 73. Each of the at least one dielectric support pillar 7P and the second array contact level dielectric layer 73 is an optional structure. As such, the second array contact level dielectric layer 73 may, or may not, be present over the insulating cap layer 70 and the retro-stepped dielectric material portion 65. The first array contact level dielectric layer 71 and the second array contact level dielectric layer 73 are herein collectively referred to as at least one array contact level dielectric layer (71, 73). In one embodiment, the at least one array contact level dielectric layer (71, 73) can include both the first and second array contact level dielectric layers (71, 73), and optionally include any additional via level dielectric layer that can be subsequently formed. In another embodiment, the at least one array contact level dielectric layer (71, 73) can include only the first array contact level dielectric layer 71 or the second array contact level dielectric layer 73, and optionally include any additional via level dielectric layer that can be subsequently formed. Alternatively, formation of the first and second array contact level dielectric layers (71, 73) may be omitted, and at least one via level dielectric layer may be subsequently formed, i.e., after formation of a backside contact via structure.

The second array contact level dielectric layer 73 and the at least one dielectric support pillar 7P can be formed as a single contiguous structure of integral construction, i.e., without any material interface therebetween. In another embodiment, the portion of the dielectric material that is deposited over the first array contact level dielectric layer 71 concurrently with deposition of the at least one dielectric support pillar 7P can be removed, for example, by chemical mechanical planarization or a recess etch. In this case, the second array contact level dielectric layer 73 is not present, and the top surface of the first array contact level dielectric layer 71 can be physically exposed.

Memory contact via structures 88 can be formed through the first and second array contact level dielectric layers (73, 71). Specifically, a photoresist layer can be applied over the second array contact level dielectric layer 73, and can be lithographically patterned to form openings overlying the drain structures 63. An anisotropic etch can be performed to transfer the pattern in the photoresist layer through the first and second array contact level dielectric layers (73, 71) to form memory contact via cavities that extend through the first and second array contact level dielectric layers (73, 71). The memory contact via cavities can be filled with at least one conductive material. Excess portions of the at least one conductive material can be removed from above a horizontal plane including a top surface of the second array contact level dielectric layer 73. Each remaining contiguous portion of the at least one conductive material constitutes a memory contact via structure 88, which contacts a top surface of an underlying drain region 63. The photoresist layer can be subsequently removed, for example, by ashing.

Another photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. A source region 61 can be formed by implanting electrical dopants through each backside contact trench into a semiconductor portion located on, or within, the substrate (9, 10). For example, a source region 61 may be formed by implantation of dopant atoms into a portion of the semiconductor material layer 10 through each backside contact trench 79. Alternatively, a semiconductor portion can be formed on the substrate (9, 10) by deposition of a semiconductor material, for example, by selective epitaxy, and by implantation of electrical dopants into the deposited semiconductor portion.

Figure 6:
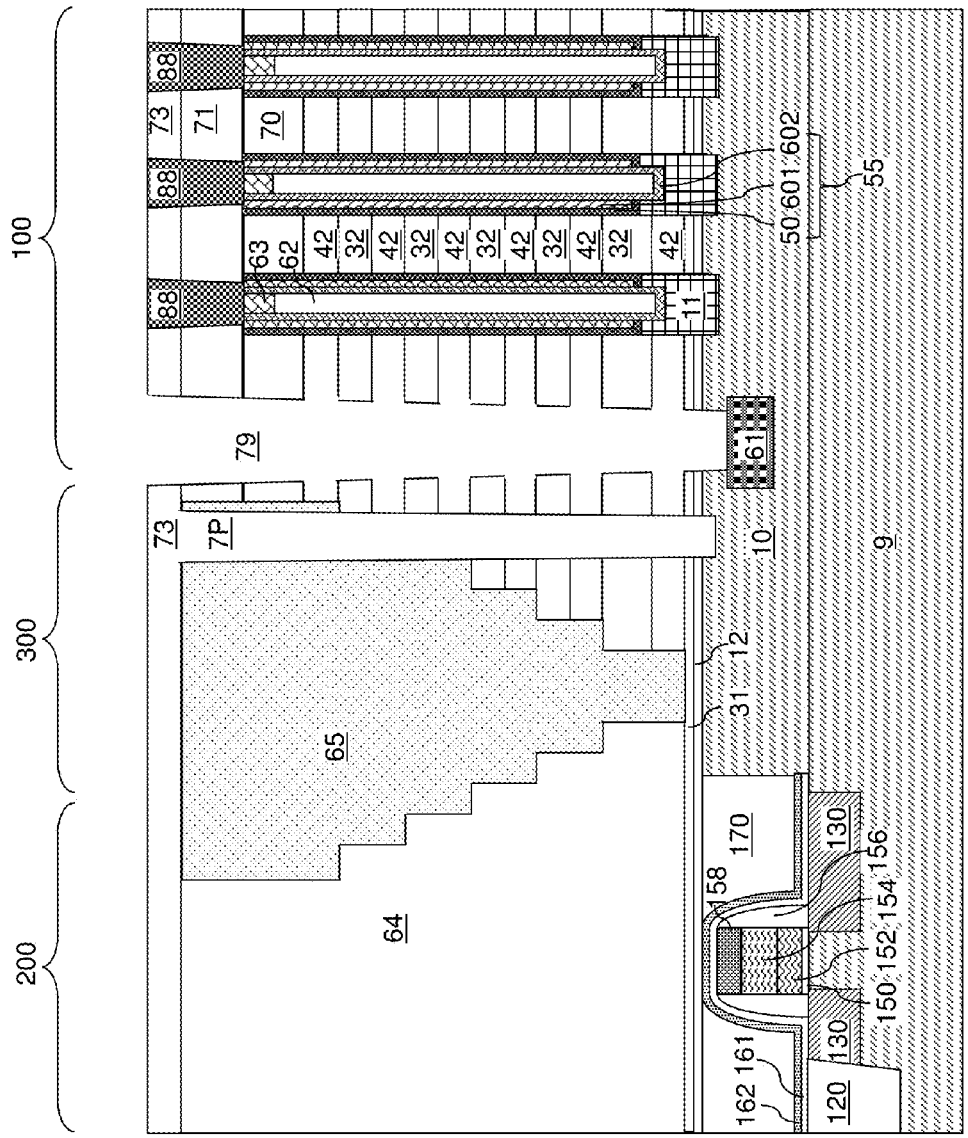
FIG. 6 is a vertical cross-sectional view of the exemplary structure after formation of backside recesses according to an embodiment of the present disclosure.

Referring to FIG. 6, an etchant that selectively etches the second material of the sacrificial material layers 42 with respect to the first material of the insulating layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

Figure 7:
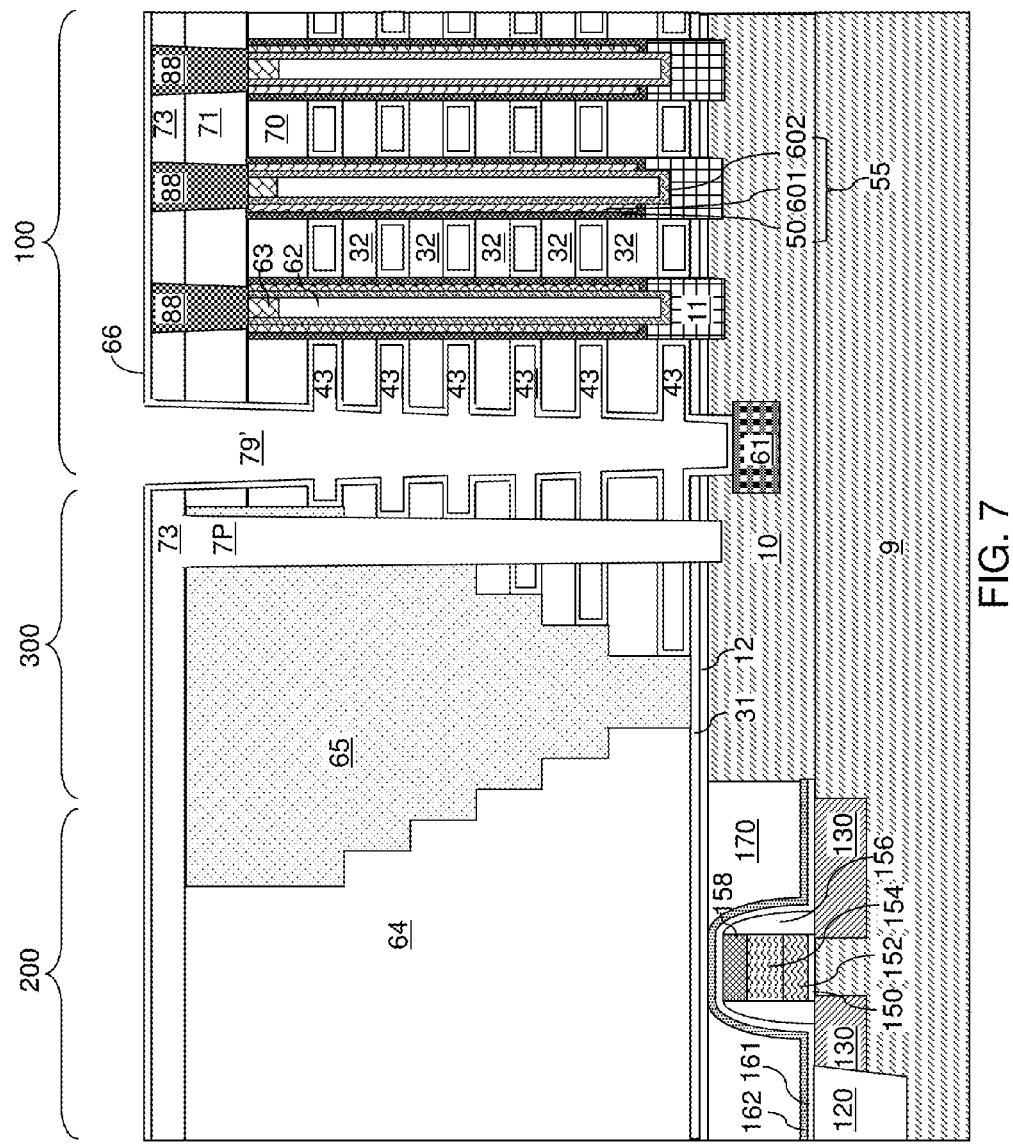
FIG. 7 is a vertical cross-sectional view of the exemplary structure after formation of a backside blocking dielectric layer according to an embodiment of the present disclosure.

Referring to FIG. 7, a backside blocking dielectric layer 66 can be optionally formed. The backside blocking dielectric layer 66 comprises a dielectric material that functions as a control gate dielectric for the control gates to be subsequently formed in the backside recesses 43. In case the at least one blocking dielectric layer 502 is present within each memory opening, the backside blocking dielectric layer 66 is optional. In case the at least one blocking dielectric layer 502 is omitted, the backside blocking dielectric layer 66 is present.

The dielectric material of the backside blocking dielectric layer 66 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. The backside blocking dielectric layer 66 can be deposited by a conformal deposition method such as chemical vapor deposition or atomic layer deposition. The thickness of the backside blocking dielectric layer 66 can be in a range from 1 nm to 10 nm, although lesser and greater thicknesses can also be employed. The backside blocking dielectric layer 66 is formed on the sidewalls of the at least one backside via trench 79, horizontal surfaces and sidewalls of the insulating layers 32, the portions of the sidewall surfaces of the memory stack structures 55 that are physically exposed to the backside recesses 43, and a top surface of a source region 61 (if formed prior to formation of the backside blocking dielectric layer 66). A backside cavity 79' is present within the portion of each backside via trench 79 that is not filled with the backside blocking dielectric layer 66.

Figure 8:
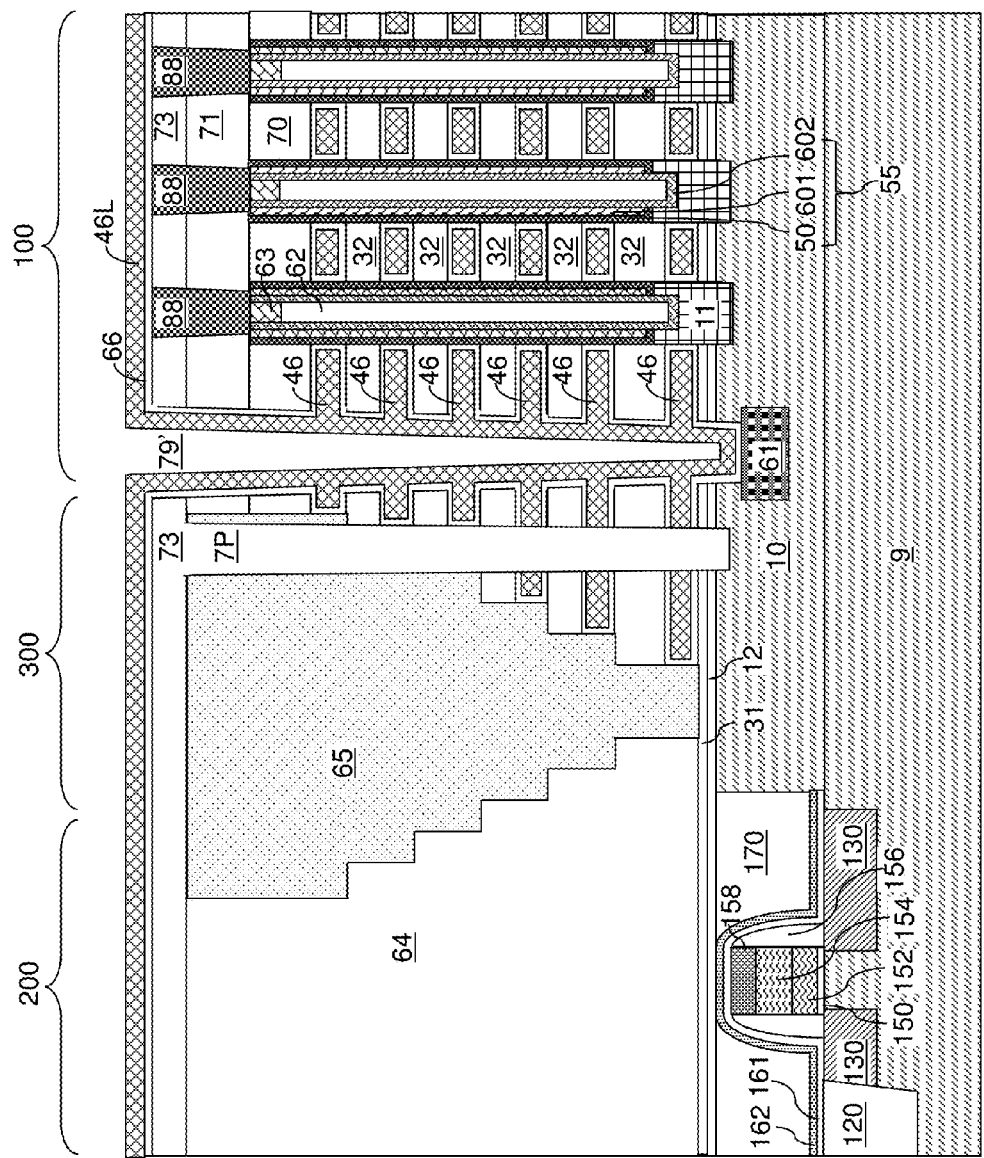
FIG. 8 is a vertical cross-sectional view of the exemplary structure after formation of electrically conductive lines according to an embodiment of the present disclosure.

Referring to FIG. 8, at least one conductive material can be deposited in the plurality of backside recesses 43, on the sidewalls of the at least one the backside contact trench 79, and over the top surface of the second array contact level dielectric layer 73 (or the topmost layer of the first array contact level dielectric layer 71 if the second array contact level dielectric layer 73 is not employed). As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 can be a combination of titanium nitride and tungsten. In one embodiment, the conductive material can be deposited by chemical vapor deposition.

A plurality of electrically conductive layers 46 can be formed in the plurality of backside recesses 43, and a contiguous conductive material layer 46L can be formed on the sidewalls of each backside contact trench 79 and over the second array contact level dielectric layer 73 (or the topmost layer of the exemplary structure in case the second array contact level dielectric layer 73 is not employed). Thus, each sacrificial material layer 42 can be replaced with an electrically conductive layer 46, which is a conductive material portion. A backside cavity 79' is present in the portion of each backside contact trench 79 that is not filled with the backside blocking dielectric layer 66 and the contiguous conductive material layer 46L.

Figure 9:
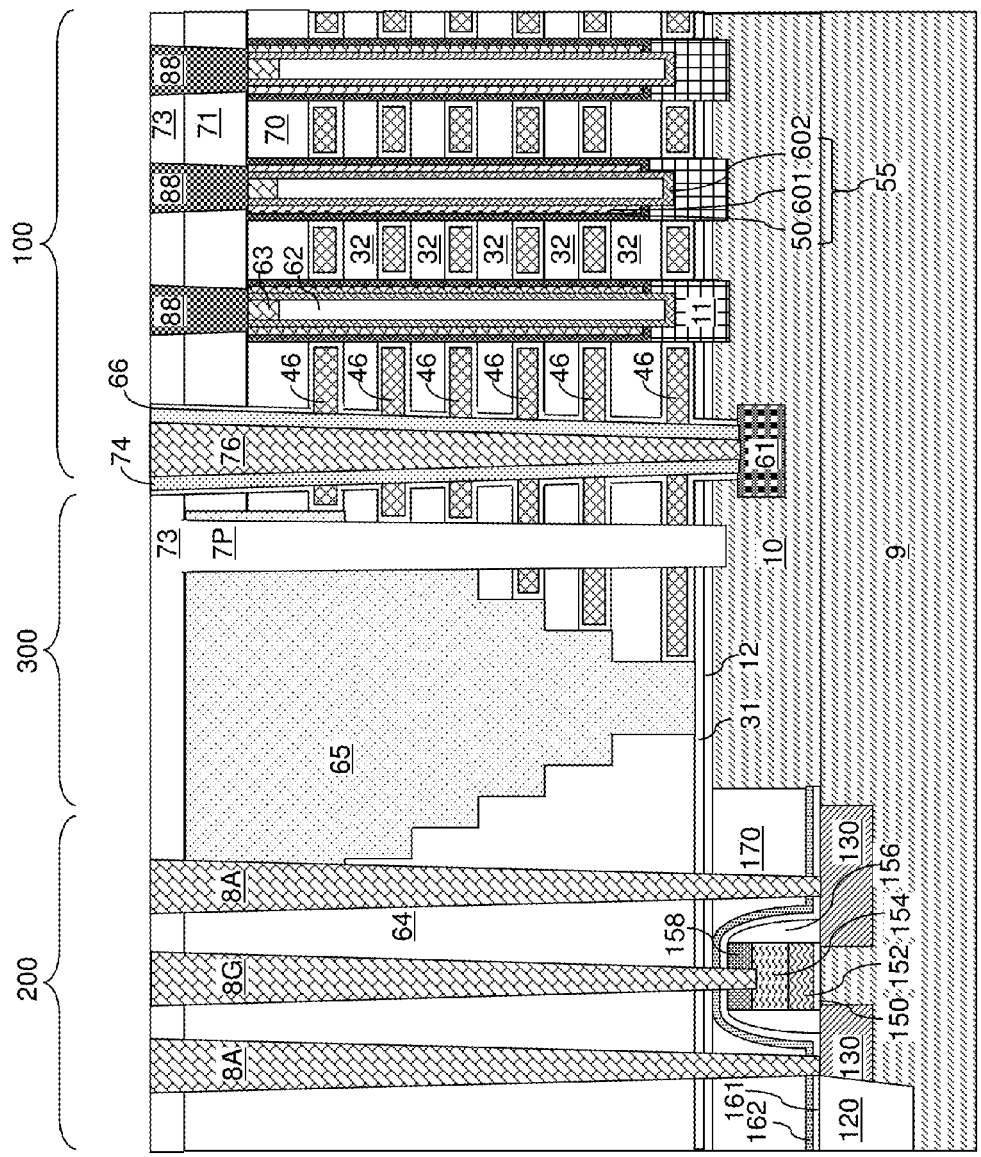
FIG. 9 is a vertical cross-sectional view of the exemplary structure after formation of an insulating spacer and a backside contact via structure according to an embodiment of the present disclosure.

Referring to FIG. 9, the deposited conductive material of the contiguous conductive material layer 46L is etched back from the sidewalls of each backside contact trench 79 and from above the second array contact level dielectric layer 73 (or the topmost layer of the exemplary structure in case the second array contact level dielectric layer 73 is not employed), for example, by an isotropic etch. Each remaining portion of the deposited conductive material in the backside recesses 43 constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

An insulating spacer 74 can be formed on the sidewalls of the backside contact trench 79 by deposition of a contiguous dielectric material layer and an anisotropic etch of its horizontal portions. The sacrificial dielectric portions 616 can be removed from above the source regions 61 during the anisotropic etch. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the second array contact level dielectric layer 73) and in the cavity laterally surrounded by the insulating spacer 74, and can be lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the second array contact level dielectric layer 73 to the bottom surface of the gate via cavity, can be less than the vertical distance between the top surface of the second array contact level dielectric layer 73 and the topmost surface of the alternating plurality (32, 46) of the insulating layers 32 and the electrically conductive layers 46. The photoresist layer can be subsequently removed, for example, by ashing.

Another photoresist layer (not shown) can be applied over the exemplary structure, and can be lithographically patterned to form openings within the contact region 200 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective electrically conductive layer 46.

The cavity laterally surrounded by the insulating spacer 74, the various via cavities in the peripheral device region 200, the control gate contact via cavities in the contact region 300, and the memory contact via cavities in the device region 100 can be filled with a conductive material to form various contact via structures. For example, a backside contact via structure 76 can be formed in the cavity surrounded by the insulating spacer 74. A gate contact via structure 8G can be formed in each gate via cavity in the peripheral device region 200. An active region via structure 8A is formed in each active region via cavity in the peripheral device region 200. Further, control gate contact via structures (not shown) can be formed within each contact via cavity that extends to a top surface of the electrically conductive layers 46 in the contact region 300. Similarly, memory contact via structures 88 can be formed to provide electrical contact to the drain regions 63.

Optionally, additional dielectric material layers (not shown) may be added to the at least one array contact level dielectric layer (71, 73). The additional dielectric material layers, if present, comprises a dielectric material such as silicon oxide, silicon nitride, silicon oxynitride, and/or organosilicate glass. Suitable metal interconnect structures can be formed in the additional dielectric material layers.

The exemplary structure comprises a monolithic three-dimensional memory device, which can comprise a vertical NAND device located over the substrate (9, 10). The electrically conductive layers 46 can comprise, or can be electrically connected to, a respective word line of the vertical NAND device.

In one embodiment, the substrate (9, 10) comprises a silicon substrate, and the vertical NAND device comprises an array of monolithic three-dimensional NAND strings over the silicon substrate. At least one memory cell in a first device level of the three-dimensional array of NAND strings is located over another memory cell in a second device level of the three-dimensional array of NAND strings. The silicon substrate can contain an integrated circuit comprising a driver circuit for the memory device located thereon.

Each NAND string can comprise a plurality of semiconductor channels, which includes the vertical semiconductor channels 60, the epitaxial channel portions 11, and at least one horizontal semiconductor channel (which is a surface portion of the semiconductor material layer 10 between the source region 61 and the optional epitaxial channel portions 11). At least one end portion of each of the plurality of semiconductor channels (such as a vertical semiconductor channel 60 and an optional epitaxial channel portion 11) extends substantially perpendicular to a top surface of the substrate (9, 10). Each NAND string can comprise a plurality of charge storage elements, which can be located, for example, within the memory material layer 504. Each charge storage element can be located adjacent to a respective one of the plurality of semiconductor channels. Each NAND string can comprise a plurality of control gate electrodes having a strip shape extending substantially parallel to the top surface of the substrate (9, 10). The plurality of control gate electrodes comprises at least a first control gate electrode located in the first device level and a second control gate electrode located in the second device level.

For each tunneling dielectric layer 506, an inner sidewall of the outer silicon oxide layer 516 can contact an outer sidewall of the first silicon oxynitride layer 526, and an inner sidewall of the second silicon oxynitride layer 536 can contact an outer sidewall of the inner silicon oxide layer 546. Each tunneling dielectric layer 506 can comprise, from outside to inside, an outer silicon oxide layer 516, a first silicon oxynitride layer 526 having the first atomic nitrogen concentration, a second silicon oxynitride layer 536 having the second atomic nitrogen concentration that is less than the first atomic nitrogen concentration, and an inner silicon oxide layer 546 that contacts a respective vertical semiconductor channel 60. The first silicon oxynitride layer 526 has the first atomic oxygen concentration, and the second silicon oxynitride layer has the second atomic oxygen concentration that is greater than the first atomic oxygen concentration.

As illustrated in the band diagram of FIG. 10A, the first silicon oxynitride layer 526 has a first bandgap that is constant throughout the first silicon oxynitride layer 526, and the second silicon oxynitride layer 536 has a second bandgap that is constant throughout the second silicon oxynitride layer 526, and is greater than the first bandgap. A first energy difference in conduction band or valence band (i.e., a first conduction or valence band offset) at the interface between the outer silicon oxide layer 516 and the first silicon oxynitride layer 526 is greater than a second energy difference in conduction band or valence band (i.e., a second conduction or valence band offset) band gap shift at the interface between the inner silicon oxide layer 546 and the second silicon oxynitride layer 536. In an embodiment, a first band gap shift at the interface (i.e., the total difference in the band gaps across the interface) between the outer silicon oxide layer 516 and the first silicon oxynitride layer 526 is greater than a second band gap shift at the interface between the inner silicon oxide layer 546 and the second silicon oxynitride layer 536. In other words, in an embodiment, the sum of the first conduction and valence band offsets (i.e., energy differences) at the interface between the outer silicon oxide layer 516 and the first silicon oxynitride layer 526 is greater than the sum of the second conduction and valence band offsets (i.e., energy differences) at the interface between the inner silicon oxide layer 546 and the second silicon oxynitride layer 536.

Referring to FIG. 10B, the advantage of the dual band gap within the middle tunneling dielectric layer (526, 536) is illustrated by a band diagram in an electrically biased condition that facilities energy relaxation of high energy holes. The presence of an additional energy barrier (illustrated by a dotted circled region) reduces relaxation of high energy holes under this bias condition.

Figure 11A:
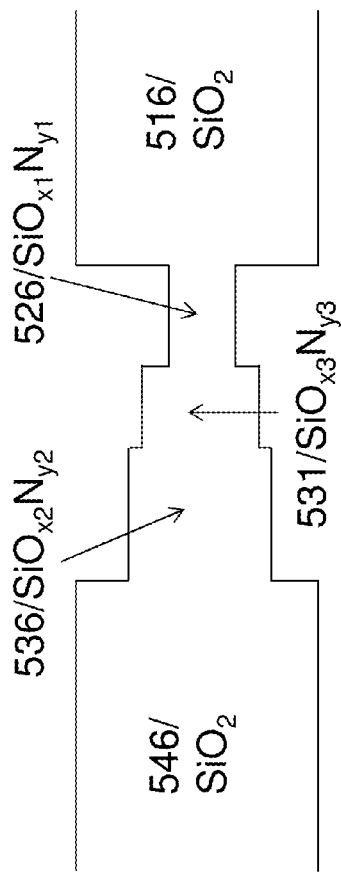
FIG. 11A is a band diagram of a tunneling dielectric layer of an alternate embodiment of the exemplary structure in the absence of an electrical bias.
Figure 11B:
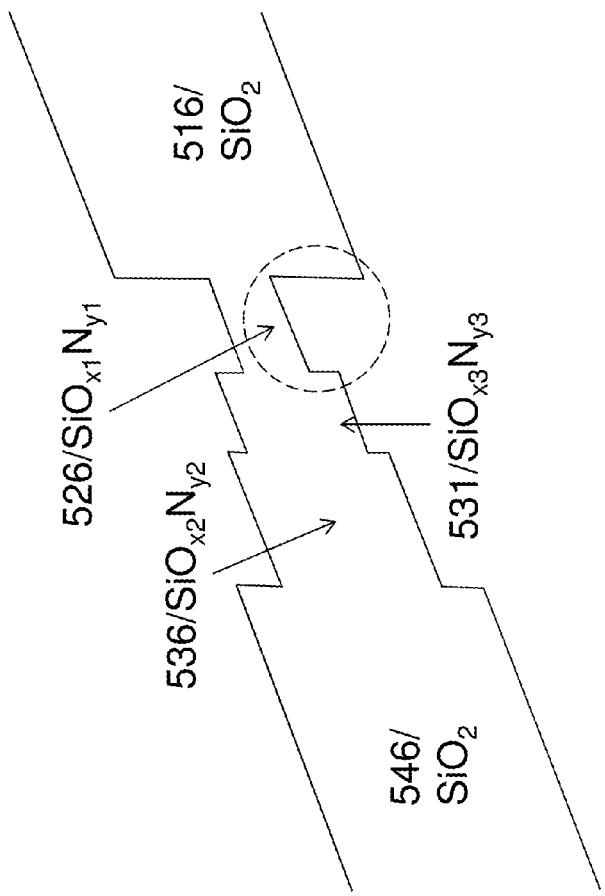
FIG. 11B is a band diagram of a tunneling dielectric layer of an alternate embodiment of the exemplary structure under an electrical bias.

Referring to FIGS. 11A and 11B, band diagrams for a tunneling dielectric layer 506 according to an alternate embodiment of the present disclosure are illustrated. At least one additional silicon oxynitride layer 531 can be formed between the first silicon oxynitride layer 526 and the second silicon oxynitride layer 536. The thicknesses of the first silicon oxynitride layer 526 and the second silicon oxynitride layer 536 can be adjusted such that the total thickness of the silicon oxynitride layers (526, 531, 536) can be substantially the same as the total thickness of the silicon oxynitride layers (526, 536) illustrated in FIGS. 10A and 10B. The nitrogen atomic concentration of each of the at least one additional silicon oxynitride layer 531 can be selected such that the nitrogen atomic concentration decreases stepwise at each interface between component silicon oxynitride layers (526, 531, 536) from the side of the outer silicon oxide layer 516 toward the side of the inner silicon oxide layer 546. Further, the oxygen atomic concentration of each of the at least one additional silicon oxynitride layer 531 can be selected such that the oxygen atomic concentration increases stepwise at each interface between component silicon oxynitride layers (526, 531, 536) from the side of the outer silicon oxide layer 516 toward the side of the inner silicon oxide layer 546. For example, if the at least one additional silicon oxynitride layer 531 comprises a silicon oxynitride layer having a composition of $SiO_{x3}N_{y3}$, y1 can be greater than y3, and y3 can be greater than y2, x1 can be less than x3, and x3 can be less than x2.

Without wishing to be bound by a particular theory, is believed that providing an additional silicon oxynitride layer 536 with a higher nitrogen concentration has the following non-limited benefits. High energy holes are generated during an erase operation. The influence of the high energy holes on intrinsic trap generation can be reduced or avoided through use of the tunneling dielectric layer 506 of the present disclosure. Specifically, it is believed that neutral traps are generated by respective interaction of holes with pre-existing structural origins of the neutral traps to create the traps, and by passing of holes which creates structural origins of the neutral traps, which then generates the traps by interaction with holes as a secondary effect, as described in K. Sakakibara, et al., IEEE Trans. Electron Dev. 44 (12) (December 1997), 2274, incorporated herein by reference in its entirety.

In one embodiment of the memory device described above, holes 701, 703 are injected from the channel through the tunneling dielectric 506 during the erase operation. Without wishing to be bound by a particular theory, the present inventor believes that holes which tunnel from the silicon oxynitride region 556 of the tunnel dielectric 506 into the outer silicon oxide layer 516 of the tunnel dielectric do not interact with or generate structural origins of the neutral traps. Thus, in one non-limiting embodiment of the present disclosure, the length of the hole tunneling region is increased by adding the first silicon oxynitride layer 526 with a higher silicon nitride content and larger valence band offset at the interface with layer 516 than the second silicon oxynitride layer 536.

Figure 12:
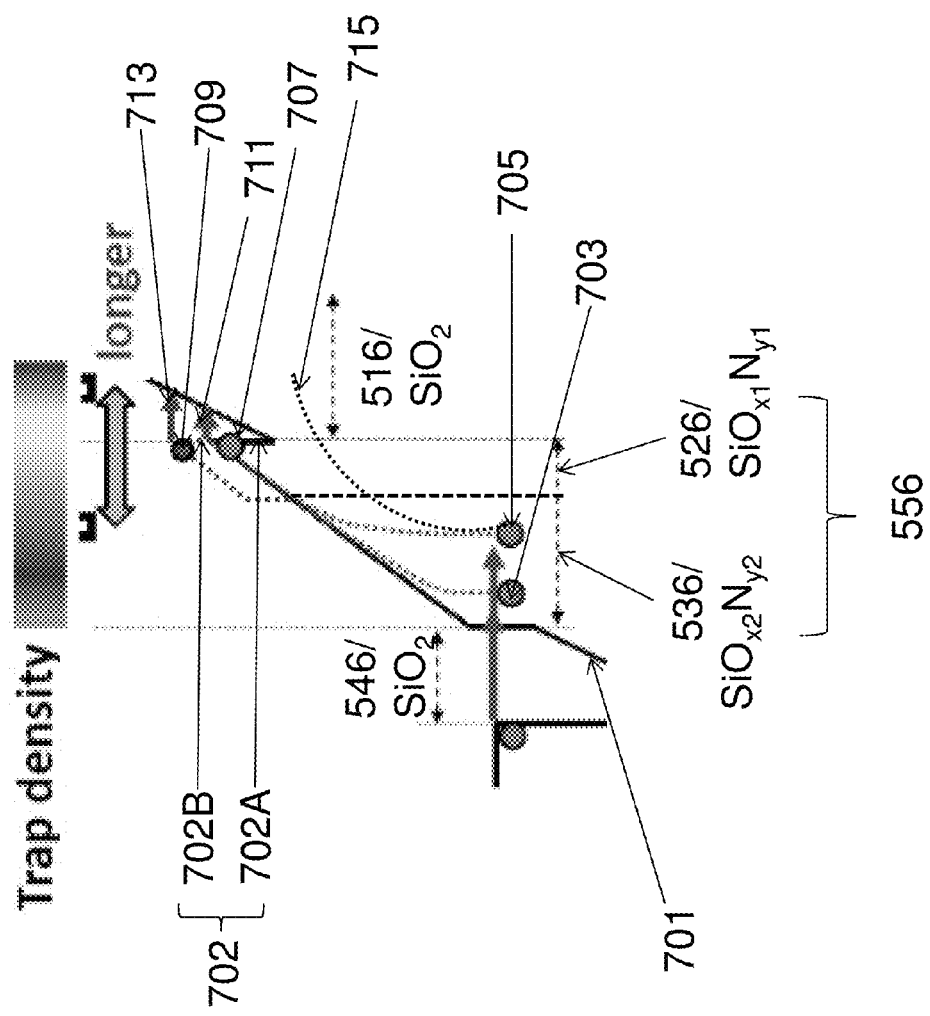
FIG. 12 is a band diagram of a tunneling dielectric layer of the exemplary structure under an electrical bias during an erase operation according to an embodiment of the present disclosure.

Specifically, as shown in FIG. 12, if layer 526 is omitted and the silicon oxynitride region 556 consists only of layer 536 which has an interface with layer 516, then the valence band 701 offset 702A at the interface is relatively small. This causes the holes 707 at the valence band edge to have a relatively short tunneling distance 711 through the interface from layer 536 into layer 516. This results in a relatively shorter region 711 with relatively low concentration of intrinsic traps where the tunneling holes do not interact with and/or create the structural origins of the neutral traps.

In contrast, if the silicon oxynitride layer 526 with the higher nitrogen concentration is present at the interface with layer 516 (as shown by the dotted line in FIG. 12), then the silicon oxynitride region 556 valence band offset (i.e., energy difference) with respect to layer 516 is increased by an amount 702B. Thus, the total valence band offset 702 in this case is equal to a sum of offsets 702A+702B. As shown in FIG. 12, this is believed to cause the holes 709 at the valence band edge to have a relatively long tunneling distance 713 through the interface from layer 526 into layer 516. This results in a relatively longer region 713 with relatively low concentration of intrinsic traps where the tunneling holes do not interact with and/or create the structural origins of the neutral traps. The estimated neutral trap density is shown at the top of FIG. 12, with the lighter portions corresponding to the lower neutral trap density and the darker portions corresponding to the higher neutral trap density.

It is believed that the hole generated neutral trap density in the middle of the silicon oxynitride region (e.g., layers 526, 536 and optionally 531) than at the interface with layer 516 because the hole fluence factor which is responsible for neutral trap generation is relatively constant across the thickness of the silicon oxynitride region 556, the hole energy factor which is also responsible for neutral trap generation is higher in the middle of the silicon oxynitride region 556 (e.g., since the high energy holes 705 have not yet relaxed to the valence band edge) than at the interface with layer 516.

As shown in FIG. 12, some holes 703 injected into the valence band 701 of the silicon oxynitride region 556 (e.g., layers 526 and 536 and optionally 531) of the tunneling dielectric 506 have a low energy and quickly relax to the valence band edge before reaching the interface with the outer silicon oxide layer 516. However, in the high electric field condition, some injected holes 705 have a higher energy and require a thicker silicon oxynitride region 556 to relax to the valence band edge before reaching the interface with the outer silicon oxide region 556. Preferably, the silicon oxynitride region 556 of the tunneling dielectric 506 has a thickness (i.e., width in the x-direction in FIG. 12) of at least 3 nm, such as 3 to 10 nm, for example, 3 to 5 nm, to allow even the high energy holes 705 to completely relax to the valence band edge before reaching the interface between the silicon oxynitride region 556 and the outer silicon oxide layer 516. This increases the likelihood that the holes will tunnel through the interface with layer 516 at the tunneling region (e.g., region 713). Otherwise, if the high energy holes 705 do not completely relax, then they may be directly injected (rather than tunnel) as shown by line 715 from the silicon oxynitride region 556 into the outer silicon oxide layer 516 during the erase operation and generate undesirable neutral traps at the interface with layer 516, which may then trap electrons moving through the traps.

The presence of the intrinsic traps results in large charge loss in a fresh memory cell though usage, which can be stimulated by cycle stressing of the memory cell. Thus, in an embodiment of the present disclosure, the neutral trap generation at the interface of the silicon oxynitride region 556 and the outer silicon oxide layer 516 and in the inner part of the outer silicon oxide layer 516 can be reduced or suppressed during an erase operation, by adding layer 526.

Therefore, data retention characteristics of the device after cycle stress can be improved in the tunneling dielectric layer 506 of the present disclosure.

Furthermore, even if the intrinsic traps are present at the interface between layers 526 and 516 in the exemplary structures of the present disclosure, then the captured electrons in the intrinsic traps within the first silicon oxynitride layer 526 are laterally spaced from the semiconductor channel by a relatively long distance (which includes the thickness of layers 546 and 536). Thus, charge loss in a fresh memory cell is reduced or minimized. Further, since the intrinsic traps are located near a charge storage layer (such as the memory material layer 504), some captured electrons within the layer 526 of the tunneling dielectric layer 506 can be injected into the charge storage layer during a programming operation.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
    a stack of alternating layers comprising insulating layers and electrically conductive layers and located over a substrate;
    an array of memory openings extending through the stack; and
    a plurality of memory stack structures located within a respective memory opening, each of the plurality of memory structures comprising memory elements, a tunneling dielectric layer, and a vertical semiconductor channel, wherein the tunneling dielectric layer comprises, from outside to inside:
    an outer silicon oxide layer;
    a first silicon oxynitride layer having a first atomic nitrogen concentration;
    a second silicon oxynitride layer having a second atomic nitrogen concentration that is less than the first atomic nitrogen concentration; and
    an inner silicon oxide layer that contacts a respective vertical semiconductor channel.

2. The monolithic three-dimensional memory device of claim 1, wherein an inner sidewall of the first silicon oxynitride layer contacts an outer sidewall of the second silicon oxynitride layer.

3. The monolithic three-dimensional memory device of claim 2, wherein:
    an inner sidewall of the outer silicon oxide layer contact an outer sidewall of the first silicon oxynitride layer; and
    an inner sidewall of the second silicon oxynitride layer contacts an outer sidewall of the inner silicon oxide layer.

4. The monolithic three-dimensional array device of claim 1, wherein
    the first silicon oxynitride layer has a first homogeneous composition throughout; and
    the second silicon oxynitride layer has a second homogeneous composition throughout.

5. The monolithic three-dimensional array device of claim 1, wherein:
    the first silicon oxynitride layer has a first bandgap that is constant throughout the first silicon oxynitride layer; and
    the second silicon oxynitride layer has a second bandgap that is constant throughout the second silicon oxynitride layer, and is greater than the first bandgap.

6. The monolithic three-dimensional array device of claim 1, wherein a first energy difference in conduction band or valence band at an interface between the outer silicon oxide layer and the first silicon oxynitride layer is greater than a second energy difference in conduction band or valence band at an interface between the inner silicon oxide layer and the second silicon oxynitride layer.

7. The monolithic three-dimensional array device of claim 1, wherein:
    the first silicon oxynitride layer and the second silicon oxynitride layer have a combined thickness of at least 3 nm;
    the first silicon oxynitride layer has a first atomic oxygen concentration; and
    the second silicon oxynitride layer having a second atomic oxygen concentration that is greater than the first atomic oxygen concentration.

8. The monolithic three-dimensional memory device of claim 1, wherein
    the first silicon oxynitride layer consists essentially of silicon, oxygen, and nitrogen; and
    the second silicon oxynitride layer consists essentially of silicon, oxygen, and nitrogen.

9. The monolithic three-dimensional memory device of claim 1, wherein:
    the first silicon oxynitride layer has a composition of $SiO_{x1}N_{y1}$; and
    the second silicon oxynitride layer has a composition of $SiO_{x2}N_{y2}$,
wherein:
    x1 is in a range from 0.5 to 1.5;
    y1 is in a range from 0.33 to 1;
    x2 is in a range from 0.75 to 1.9; and
    y2 is in a range from 0.07 to 0.83.

10. The monolithic three-dimensional memory device of claim 1, wherein:
    x1+1.5y1 is substantially equal to 2.0; and
    x2+1.5y2 is substantially equal to 2.0.

11. The monolithic three-dimensional memory device of claim 1, wherein a combination of the first silicon oxynitride layer and the second silicon oxynitride layer has a thickness in a range from 1.5 nm to 6.0 nm.

12. The monolithic three-dimensional memory device of claim 1, further comprising:
    a source region located in, or on, the substrate; and
    a plurality of drain regions located at a top end of a respective memory stack structure,
wherein a semiconductor channel including a horizontal semiconductor portion and a respective vertical semiconductor channel extends contiguously between the source region and each of the plurality of drain regions.

13. The monolithic three-dimensional memory device of claim 1, wherein:

the monolithic three-dimensional memory device comprises a vertical NAND device located over the substrate; and the electrically conductive layers comprise, or are electrically connected to, a respective word line of the vertical NAND device.

14. The monolithic three-dimensional memory device of claim 13, wherein:

the substrate comprises a silicon substrate;

the vertical NAND device comprises an array of monolithic three-dimensional NAND strings over the silicon substrate;

at least one memory cell in a first device level of the three-dimensional array of NAND strings is located over another memory cell in a second device level of the three-dimensional array of NAND strings;

the silicon substrate contains an integrated circuit comprising a driver circuit for the memory device located thereon; and the three-dimensional array of NAND strings comprises:
 a plurality of semiconductor channels, wherein at least one end portion of each of the plurality of semiconductor channels extends substantially perpendicular to a top surface of the substrate;
 a plurality of charge storage elements, each charge storage element located adjacent to a respective one of the plurality of semiconductor channels; and
 a plurality of control gate electrodes having a strip shape extending substantially parallel to the top surface of the substrate, the plurality of control gate electrodes comprise at least a first control gate electrode located in the first device level and a second control gate electrode located in the second device level.

15. A method of manufacturing a memory device, comprising:

forming a stack of alternating layers comprising insulating layers and material layers over a substrate;

forming a plurality of memory openings through the stack;

forming a set of memory elements within each of the plurality of memory openings;

forming an outer silicon oxide layer over each set of memory elements;

forming a first silicon oxynitride layer having a first atomic nitrogen concentration over the outer silicon oxide layer;

forming a second silicon oxynitride layer having a second atomic nitrogen concentration that is less than the first atomic nitrogen concentration over the first silicon oxynitride layer; and forming an inner silicon oxide layer over the second silicon oxynitride layer; and forming a vertical semiconductor channel on the inner silicon oxide layer.

16. The method of claim 15, further comprising removing portions of the outer silicon oxide layer, the first and second silicon oxynitride layers, and the inner silicon oxide layer from above a horizontal plane including a top surface of the stack, wherein each remaining adjoining portions of the outer silicon oxide layer, the first and second silicon oxynitride layers, and the inner silicon oxide layer constitutes a tunneling dielectric layer of a memory stack structure.

17. The method of claim 15, wherein:

the second silicon oxynitride layer is formed directly on an inner sidewall of a respective first silicon oxynitride layer;

the first silicon oxynitride layer is formed directly on an inner sidewall of a respective outer silicon oxide layer contact; and the inner silicon oxide layer is formed directly on an inner sidewall of a respective second silicon oxynitride layer.

18. The method of claim 15, wherein each of the first silicon oxynitride layer and the second silicon oxynitride layer is deposited by a conformal deposition method selected from chemical vapor deposition and atomic layer deposition.

19. The method of claim 15, wherein the first silicon oxynitride layer is formed by:

depositing an initial silicon nitride layer over the outer silicon oxide layer; and converting the initial silicon nitride layer into the first silicon oxynitride layer by performing an oxidation process on the initial silicon nitride layer.

20. The method of claim 19, wherein the oxidation process comprises at least one a thermal oxidation process and a plasma oxidation process.

21. The method of claim 19, wherein the second silicon oxynitride layer is formed by:

depositing an initial silicon oxide layer over the outer silicon oxide layer; and converting the initial silicon oxide layer into the silicon oxynitride layer by performing a nitridation process on the initial silicon oxide layer.

22. The method of claim 15, wherein:

the first silicon oxynitride layer has a first bandgap that is constant throughout the first silicon oxynitride layer; and the second silicon oxynitride layer has a second bandgap that is constant throughout the second silicon oxynitride layer, and is greater than the first bandgap.

23. The method of claim 15, wherein a first energy difference in conduction band or valence band at an interface between the outer silicon oxide layer and the first silicon oxynitride layer is greater than a second energy difference in conduction band or valence band at an interface between the inner silicon oxide layer and the second silicon oxynitride layer.

24. The method of claim 15, wherein:

the first silicon oxynitride layer and the second silicon oxynitride layer have a combined thickness of at least 3 nm;

the first silicon oxynitride layer has a first atomic oxygen concentration; and the second silicon oxynitride layer having a second atomic oxygen concentration that is greater than the first atomic oxygen concentration.

25. The method of claim 15, wherein the first silicon oxynitride layer consists essentially of silicon, oxygen, and nitrogen; and the second silicon oxynitride layer consists essentially of silicon, oxygen, and nitrogen.

26. The method of claim 15, wherein:

the first silicon oxynitride layer has a composition of $SiO_{x1}N_{y1}$; and the second silicon oxynitride layer has a composition of $SiO_{x2}N_{y2}$, wherein:

x1 is in a range from 0.5 to 1.5;

y1 is in a range from 0.33 to 1;

x2 is in a range from 0.75 to 1.9;

y2 is in a range from 0.07 to 0.83;

x1+1.5y1 is substantially equal to 2.0; and x2+1.5y2 is substantially equal to 2.0.

27. The method of claim 15, wherein a combination of the first silicon oxynitride layer and the second silicon oxynitride layer has a thickness in a range from 1.5 nm to 6.0 nm.

28. The method of claim 15, further comprising:
forming a source region located in, or on, the substrate; and
forming a plurality of drain regions on a top end of a respective memory stack structure,
wherein a semiconductor channel including a horizontal semiconductor portion and a respective vertical semiconductor channel extends contiguously between the source region and each of the plurality of drain regions.

29. The method of claim 15, wherein:
the monolithic three-dimensional memory device comprises a vertical NAND device located over the substrate; and
the electrically conductive layers comprise, or are electrically connected to, a respective word line of the vertical NAND device.

30. The method of claim 29, wherein:
the substrate comprises a silicon substrate;
the vertical NAND device comprises an array of monolithic three-dimensional NAND strings over the silicon substrate;
at least one memory cell in a first device level of the three-dimensional array of NAND strings is located over another memory cell in a second device level of the three-dimensional array of NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *